(12) United States Patent
Yang et al.

(10) Patent No.: US 11,901,208 B2
(45) Date of Patent: Feb. 13, 2024

(54) SUBSTRATE CHUCK FOR SELF-ASSEMBLING SEMICONDUCTOR LIGHT EMITTING DIODES

(71) Applicant: LG ELECTRONICS INC., Seoul (KR)

(72) Inventors: Inbum Yang, Seoul (KR); Imdeok Jung, Seoul (KR); Junghun Rho, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 406 days.

(21) Appl. No.: 16/857,818

(22) Filed: Apr. 24, 2020

(65) Prior Publication Data

US 2021/0090929 A1 Mar. 25, 2021

(30) Foreign Application Priority Data

Sep. 19, 2019 (KR) .................. 10-2019-0115574
Jan. 22, 2020 (KR) .................. 10-2020-0008857

(51) Int. Cl.
*H01L 21/68* (2006.01)
*H01L 21/50* (2006.01)
(Continued)

(52) U.S. Cl.
CPC .............. *H01L 21/68* (2013.01); *H01L 21/50* (2013.01); *H01L 21/67126* (2013.01);
(Continued)

(58) Field of Classification Search
CPC ............. H01L 2021/6009; H01L 21/50; H01L 21/67126; H01L 21/67144; H01L 21/68;
(Continued)

(56) References Cited

U.S. PATENT DOCUMENTS 3,550,479 A * 12/1970 Pfaff, Jr. ............... B23Q 35/12
219/69.17
9,177,842 B2 * 11/2015 Englhardt ......... H01L 21/67178
(Continued)

FOREIGN PATENT DOCUMENTS

CN         108682312 A      10/2018
DE  10 2016 011 747 A1      3/2018
(Continued)

OTHER PUBLICATIONS

U.S. Appl. No. 16/842,323, filed Apr. 7, 2020,
(Continued)

*Primary Examiner* — Minh N Trinh
(74) *Attorney, Agent, or Firm* — Birch. Stewart, Kolasch & Birch, LLP

(57) ABSTRACT

Discussed is a substrate chuck for allowing one surface of a substrate to be in contact with a fluid, the substrate chuck including a first frame having a hole at a central portion thereof; a second frame having a hole at a central portion thereof and disposed to overlap the first frame; and a frame transfer part configured to vertically move the second frame with respect to the first frame, wherein the first frame includes: a bottom portion at which the hole is formed; and a sidewall portion formed on a peripheral edge of the bottom portion, and wherein a height of the sidewall portion is greater than a depth at which the substrate is placed into the fluid.

19 Claims, 25 Drawing Sheets

(51) Int. Cl.
*H01L 21/67* (2006.01)
*H01L 25/075* (2006.01)
*H01L 33/00* (2010.01)
*H05K 13/04* (2006.01)
*H05K 13/02* (2006.01)
*H01L 21/60* (2006.01)

(52) U.S. Cl.
CPC .... *H01L 21/67144* (2013.01); *H01L 25/0753* (2013.01); *H01L 33/0095* (2013.01); *H05K 13/027* (2013.01); *H05K 13/046* (2013.01); *H05K 13/0478* (2013.01); *H01L 2021/6009* (2013.01); *H01L 2933/005* (2013.01); *H01L 2933/0066* (2013.01)

(58) Field of Classification Search
CPC ....... H01L 21/6835; H01L 2221/68354; H01L 2221/68381; H01L 2224/75655; H01L 2224/7598; H01L 2224/95101
See application file for complete search history.

(56) References Cited

U.S. PATENT DOCUMENTS

| | | |
|---|---|---|
| 9,825,202 B2 | 11/2017 | Schuele et al. |
| 2006/0196415 A1* | 9/2006 | Lee ................... B82Y 10/00 118/102 |
| 2008/0218299 A1 | 9/2008 | Arnold |
| 2009/0265929 A1 | 10/2009 | Nakagawa et al. |
| 2011/0179640 A1 | 7/2011 | Arnold et al. |
| 2011/0277917 A1 | 11/2011 | Nakagawa |
| 2012/0291950 A1 | 11/2012 | Sugiyama et al. |
| 2013/0302935 A1 | 11/2013 | Dai et al. |
| 2014/0097088 A1 | 4/2014 | Stowell et al. |
| 2015/0228622 A1 | 8/2015 | Koyanagi et al. |
| 2016/0126049 A1 | 5/2016 | Ahn et al. |
| 2016/0155892 A1 | 6/2016 | Li et al. |
| 2017/0229330 A1 | 8/2017 | Tkachenko et al. |
| 2018/0012873 A1 | 1/2018 | Lee et al. |
| 2018/0033986 A1 | 2/2018 | Takai et al. |
| 2018/0102352 A1 | 4/2018 | Sasaki et al. |
| 2018/0158713 A1 | 6/2018 | Okita et al. |
| 2018/0190614 A1 | 7/2018 | Kumar et al. |
| 2018/0312421 A1 | 11/2018 | Garner et al. |
| 2019/0013229 A1* | 1/2019 | Cho ................... H01L 21/68742 |
| 2019/0058080 A1 | 2/2019 | Ahmed et al. |
| 2021/0090916 A1* | 3/2021 | Yang ................... H01L 21/6835 |
| 2021/0090925 A1* | 3/2021 | Yang ................... H01L 21/67757 |
| 2021/0090928 A1* | 3/2021 | Yang ................... H01L 21/67709 |
| 2021/0090929 A1* | 3/2021 | Yang ................... H01L 25/0753 |

FOREIGN PATENT DOCUMENTS

| | | |
|---|---|---|
| JP | 7-297210 A | 11/1995 |
| JP | 2003-129297 A | 5/2003 |
| JP | 2005-174979 A | 6/2005 |
| JP | 2005-326873 A | 11/2005 |
| JP | 2011-211136 A | 10/2011 |
| JP | 2017-539097 A | 12/2017 |
| KR | 10-0928951 B1 | 11/2009 |
| KR | 10-2015-0005628 A | 1/2015 |
| KR | 10-2017-0071514 A | 6/2017 |
| KR | 10-2018-0030454 A | 3/2018 |
| KR | 10-2018-0115584 A | 10/2018 |
| KR | 10-2019-0017691 A | 2/2019 |
| KR | 10-2019-0018385 A | 2/2019 |
| KR | 10-2019-0085892 A | 7/2019 |
| KR | 10-2019-0097946 A | 8/2019 |
| KR | 10-2019-0099164 A | 8/2019 |
| KR | 10-2019-0105537 A | 9/2019 |
| KR | 10-2020-0014865 A | 2/2020 |
| KR | 10-2020-0026761 A | 3/2020 |
| WO | WO 2008/054326 A1 | 5/2008 |
| WO | WO 2011/114741 A1 | 9/2011 |

OTHER PUBLICATIONS

U.S. Appl. No. 16/818,469, filed Mar. 13, 2020.
U.S. Appl. No. 16/818,296, filed Mar. 13, 2020.
U.S. Appl. No. 16/818,222, filed Mar. 13, 2020.
U.S. Appl. No. 16/842,347, filed Apr. 7, 2020.

* cited by examiner

SUBSTRATE CHUCK FOR SELF-ASSEMBLING SEMICONDUCTOR LIGHT EMITTING DIODES

CROSS-REFERENCE TO RELATED APPLICATION

Pursuant to 35 U.S.C. § 119(a), this application claims the benefit of the earlier filing date and the right of priority to Korean Patent Application No. 10-2019-0115574, filed on Sep. 19, 2019 and Korean Patent Application No. 10-2020-0008857, filed on Jan. 22, 2020, the entire contents of all these applications are hereby expressly incorporated by reference into the present application.

BACKGROUND

1. Technical Field

The present disclosure relates to a method for manufacturing a display device, and one particular implementation relates to a substrate chuck for self-assembling micro LEDs.

2. Description of the Related Art

In recent years, in the field of display technology, liquid-crystal displays (LCD), organic light-emitting diode (OLED) displays, microLED displays, etc. have been competing to realize large-area displays.

Meanwhile, semiconductor microLEDs (μLED) with a diameter or cross-sectional area less than 100 microns, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick & place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes a new manufacturing device for self-assembling microLEDs.

SUMMARY

One aspect of the present disclosure is to provide a new manufacturing process that provides high reliability in large-screen displays using micro-size semiconductor light-emitting diodes.

Another aspect of the present disclosure is to provide a structure for preventing a substrate from being broken due to buoyancy acting on the substrate when a semiconductor light emitting diode is self-assembled on a temporary substrate or a wiring substrate.

In order to achieve the above aspects, the present disclosure provides a substrate chuck for allowing one surface of a substrate to be submerged in a fluid. The substrate chuck can include a first frame having a hole at a central portion thereof, a second frame having a hole at a central portion thereof and disposed to overlap the first frame, and a frame transfer part configured to vertically move the second frame with respect to the first frame. The first frame can include a bottom portion at which the hole is formed, and a sidewall portion formed on an edge of the bottom portion. A height of the sidewall portion can be greater than a depth at which the substrate is submerged into the fluid.

In one embodiment, the first and second frames can be disposed at both sides with the substrate interposed therebetween, and the holes formed at the respective first and second frames can be disposed to overlap an assembly surface of the substrate.

In one embodiment, the frame transfer part can transfer the second frame such that the one surface of the substrate is submerged in the fluid while the second frame presses the substrate.

In one embodiment, the second frame can be surrounded by the sidewall portion while pressing the substrate.

In one embodiment, the substrate chuck can further include a fixing part configured to fix the frame transfer part and the first frame. The frame transfer part can connect the fixing part and the second frame, and have a variable length so that the second frame moves vertically.

In one embodiment, the second frame can press at least four edges among edges provided on the substrate while pressing the substrate.

In one embodiment, the first frame can include a sealing part disposed at an edge of the hole, and the sealing part can be arranged to press the substrate as at least one of the first and second frames presses the substrate.

In one embodiment, the sealing part can be made of a material that is not attached to the substrate.

In one embodiment, the first frame can include an electrode connection part configured to apply power to an assembly electrode provided at the substrate so as to generate an electric field.

In one embodiment, the sealing part can be disposed closer to the hole than the electrode connection part.

With the above configuration according to the present disclosure, large numbers of semiconductor light-emitting diodes can be assembled at a time on a display device where individual pixels are made up of microLEDs.

As such, according to the present disclosure, many semiconductor light-emitting diodes can be pixelated on a small-sized wafer and then transferred onto a large-area substrate. This enables the manufacture of a large-area display device at a low cost.

Moreover, according to the present disclosure, a low-cost, high-efficiency, and quick transfer of semiconductor light-emitting diodes can be done, regardless of the sizes or numbers of parts and the transfer area, by simultaneously transferring them in the right positions in a solution by using a magnetic field and an electric field.

The assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

Further, according to the present disclosure, it is possible to prevent a fluid from penetrating between an assembly surface of a substrate and an opposite surface to the assembly surface during self-assembly. This results in preventing the substrate from being broken during the self-assembly.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements can also be present.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head mounted display (HMD), a desktop computer, and the like. However, it will be readily apparent to those skilled in the art that the configuration according to the embodiments described herein can also be applied to a new product type that will be developed later if the device is a device capable of emitting light.

Figure 1:
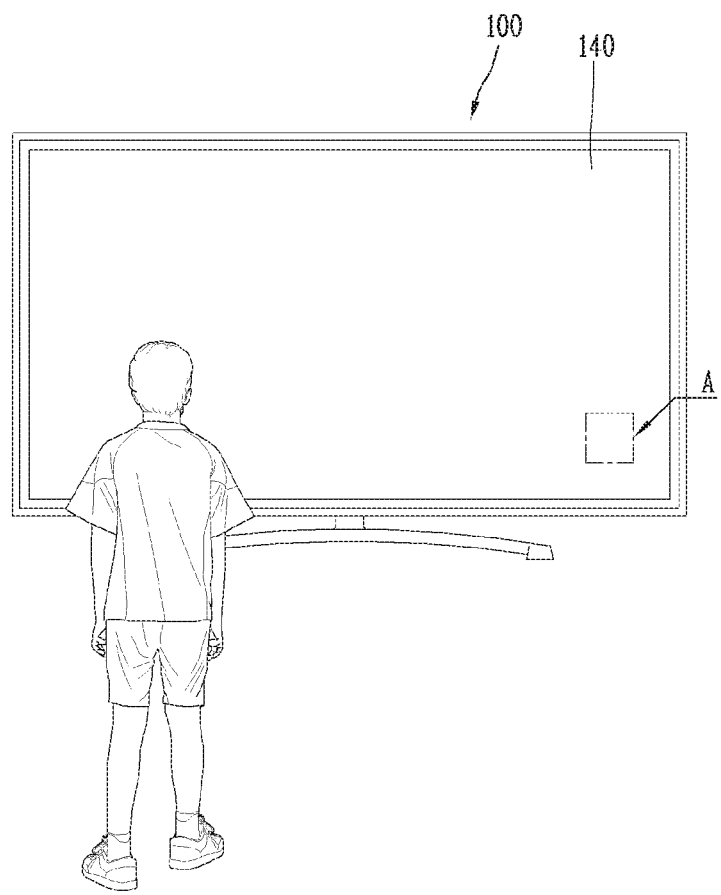
FIG. 1 is a conceptual view illustrating one embodiment of a display device using semiconductor light emitting diodes according to the present disclosure.
Figure 2:
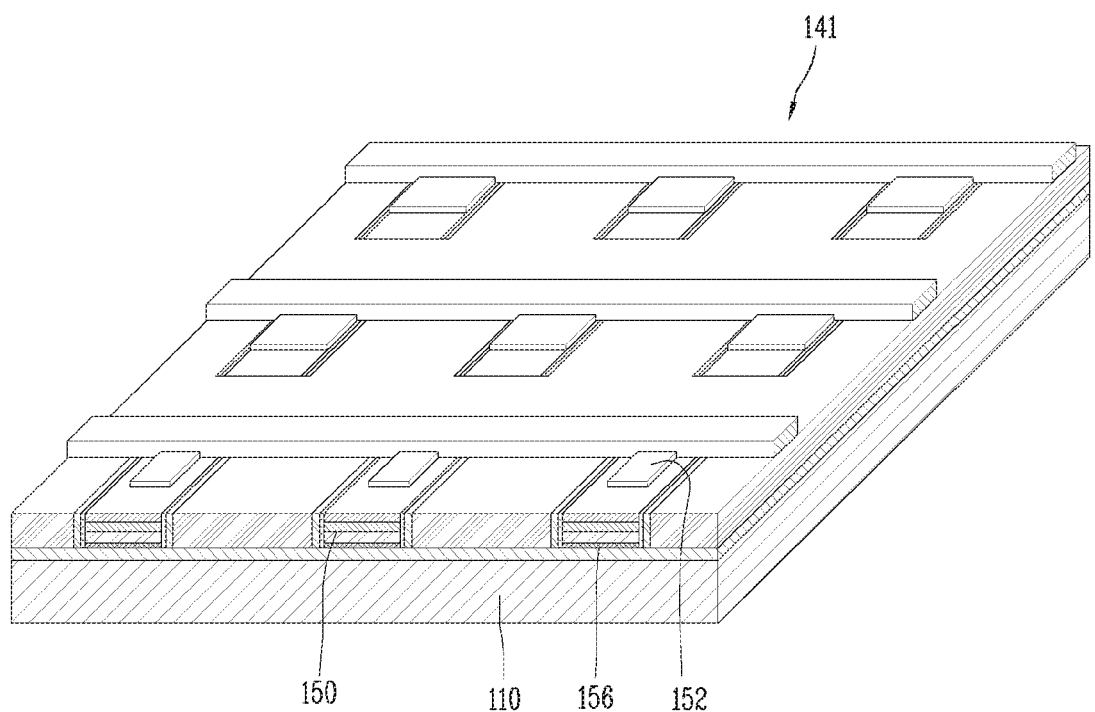
FIG. 2 is a partial enlarged view of the portion A in the display device of FIG. 1.
Figure 3:
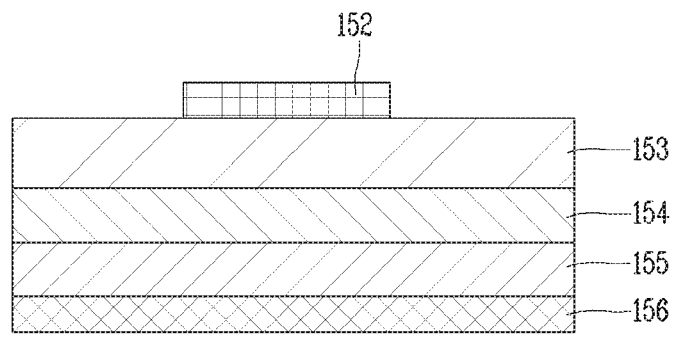
FIG. 3 is an enlarged view of the semiconductor light-emitting diodes of FIG. 2.
Figure 4:
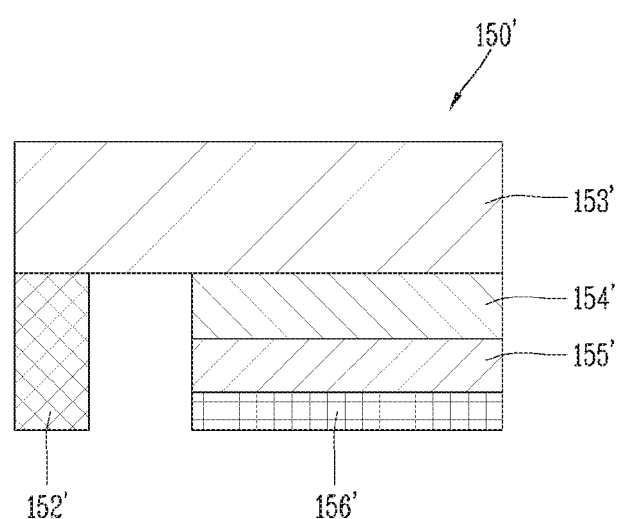
FIG. 4 is an enlarged view illustrating another embodiment of the semiconductor light-emitting diodes of FIG. 2.

FIG. 1 is a conceptual diagram illustrating one embodiment of a display device using semiconductor light-emitting diodes according to the present disclosure, FIG. 2 is a partial enlarged view of the portion A in the display device of FIG. 1, FIG. 3 is an enlarged view of the semiconductor light-emitting diodes of FIG. 2, and FIG. 4 is an enlarged view illustrating another embodiment of the semiconductor light-emitting diodes of FIG. 2. All the components of the display device according to all embodiments of the present disclosure are operatively coupled and configured.

According to the illustration, information processed by a controller of a display device 100 can be output by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs can be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixel can contain at least three microLEDs.

More specifically, referring to FIG. 3, the semiconductor light-emitting diode 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type semiconductor layer 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. The electrodes can be disposed in the upward/downward direction in the vertical semiconductor light-emitting diode 150, thereby providing a great advantage capable of reducing the chip size.

In another example, referring to FIG. 4, the semiconductor light-emitting diodes can be flip chip-type light-emitting diodes.

As an example of such a flip chip-type light-emitting diode, the semiconductor light-emitting diode 150' comprises a p-type electrode 156', a p-type semiconductor layer 155' formed on the p-type semiconductor layer 156', an active layer 154' formed on the p-type semiconductor layer 155', an n-type semiconductor layer 153' formed on the active layer 154', and an n-type electrode 152' vertically separated from the p-type electrode 156', on the n-type semiconductor layer 153'. In this case, both the p-type electrode 156' and the n-type electrode 152' can be electrically connected to a p electrode and n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN. However, for the red semiconductor light-emitting diodes, the p-type semiconductor layer can be P-type GaAs, and the n-type semiconductor layer can be N-type GaAs.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-explained display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can solve these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes. Also, although the illustration will be given of how horizontal semiconductor light-emitting diodes are self-assembled, it can also apply to self-assembling of vertical semiconductor light-emitting diodes.

Figure 5A:
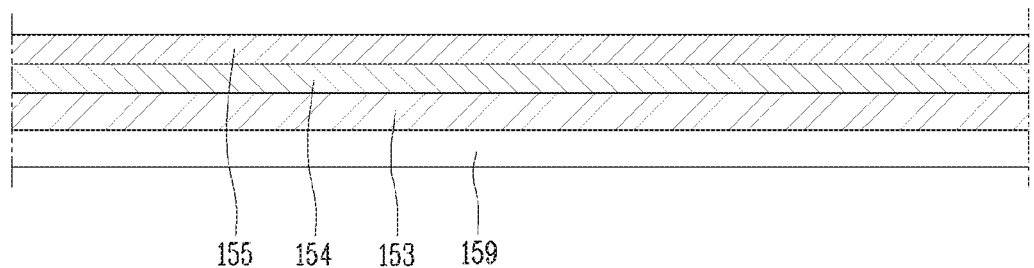
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this exemplary embodiment is illustrated by assuming the presence of the active layer, the active layer can be omitted if necessary, as stated above. In an example, the p-type semiconductor layer can be P-type GaN doped with Mg, and the n-type semiconductor layer can be N-type GaN doped with Si on the n electrode.

The growth substrate 159 (wafer) can be formed of, but not limited to, light-transmissive material—for example, at least one among sapphire ($Al_2O_3$), GaN, ZnO, and AlO. Also, the growth substrate 159 can be made from a material suitable for growing semiconductor materials or carrier wafer. The growth substrate 159 can be formed of a high thermal conducting material, and can be a conductive substrate or insulating substrate—for example, at least one among SiC, Si, GaAs, GaP, InP, and $Ga_2O_3$ substrates which have higher thermal conductivity than sapphire ($Al_2O_3$) substrates.

Figure 5B:
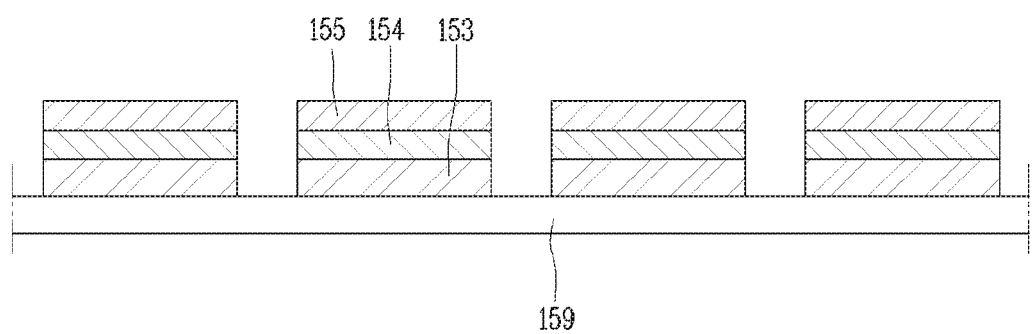

Next, a plurality of semiconductor light-emitting diodes is formed by removing at least part of the first conductive semiconductor layer 153, active layer 154, and second conductive semiconductor layer 155 (FIG. 5B).

More specifically, isolation is performed so that the light-emitting diodes form a light-emitting diode array. That is, a plurality of semiconductor light-emitting diodes is formed by vertically etching the first conductive semiconductor layer 153, active layer 154, and second conductive semiconductor layer 155.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Figure 5C:
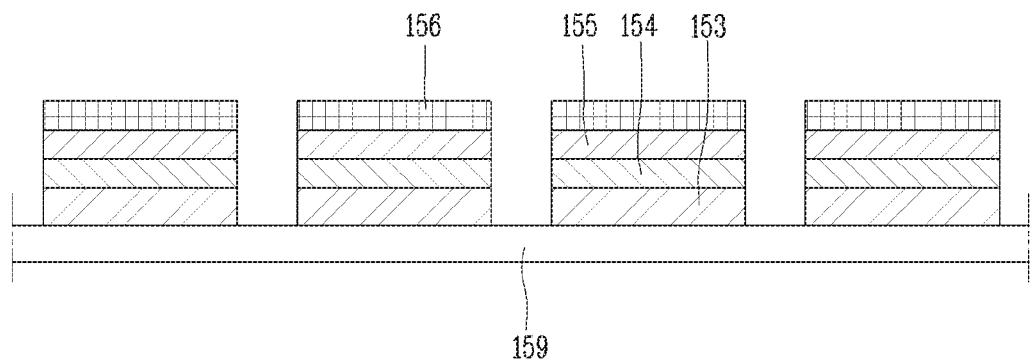

Next, a second conductive electrode 156 (or p-type electrode) is formed on one surface of the second conductive semiconductor layer 155 (FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Figure 5D:
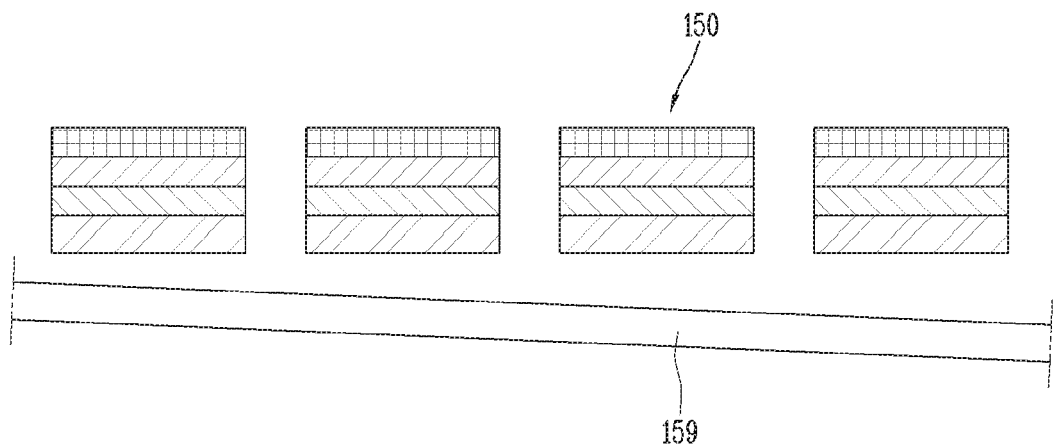

Next, the growth substrate 159 is removed, thus leaving a plurality of semiconductor light-emitting diodes. For example, the growth substrate 159 can be removed using laser lift-off (LLO) or chemical lift-off (CLO) (FIG. 5D).

Figure 5E:
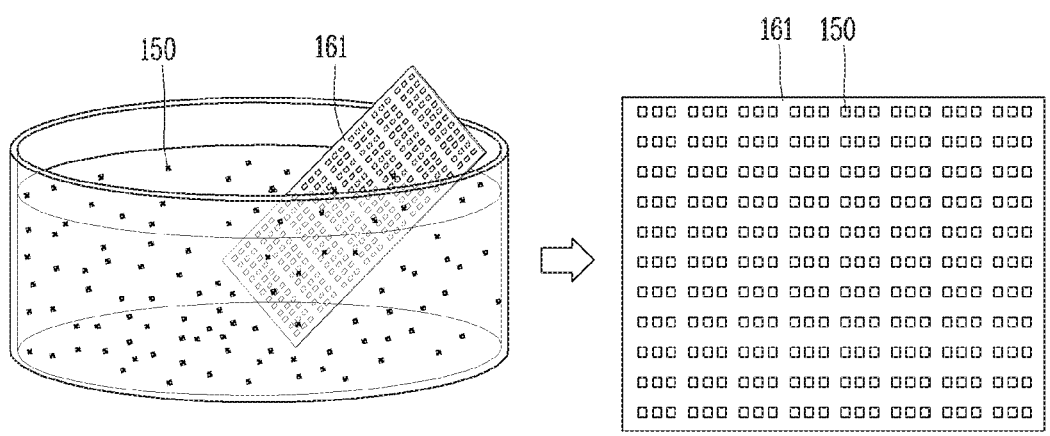

Afterwards, the step of mounting the semiconductor light-emitting didoes 150 on a substrate in a chamber filled with a fluid is performed (FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate can be an assembly substrate 161.

In another example, a wiring substrate, instead of the assembly substrate 161, can be put into an assembly chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells (not shown) into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
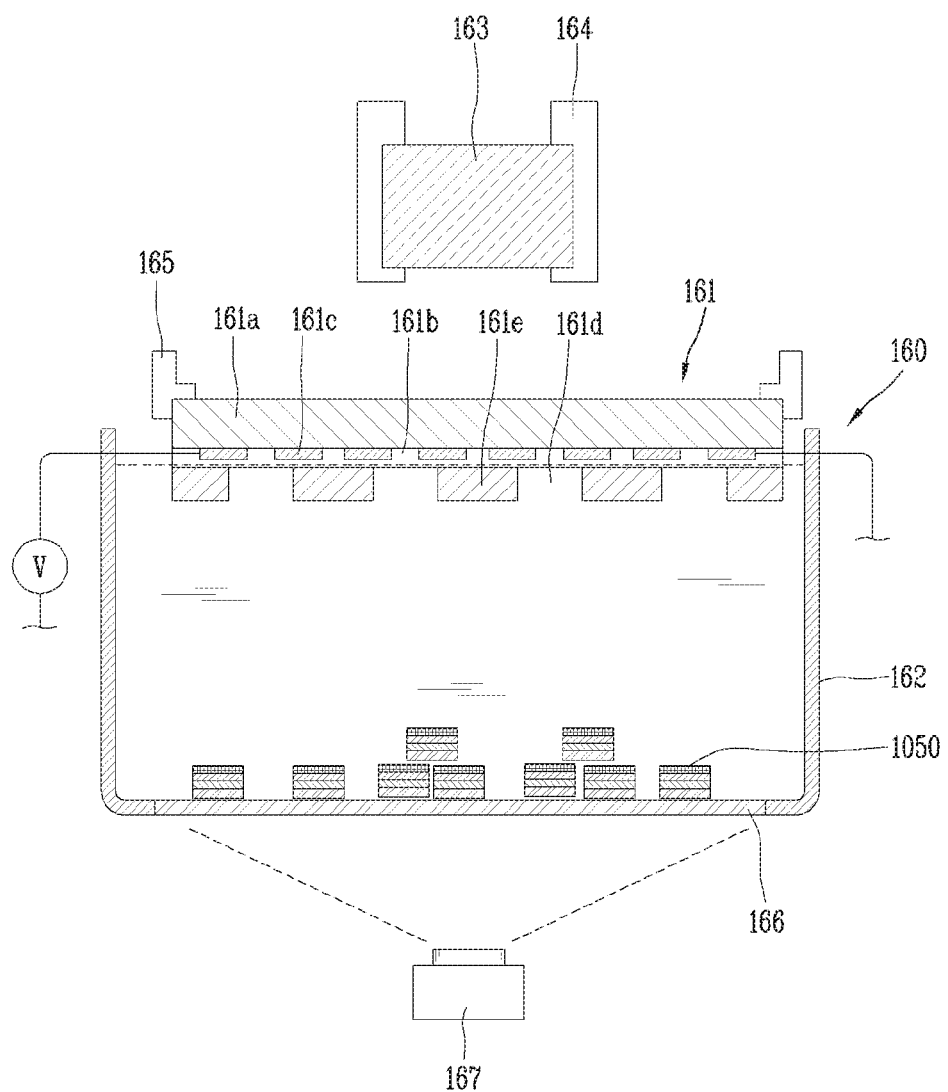
FIG. 6 is a conceptual diagram illustrating an example of a device for self-assembling semiconductor light-emitting diodes according to the present disclosure.
Figure 7:
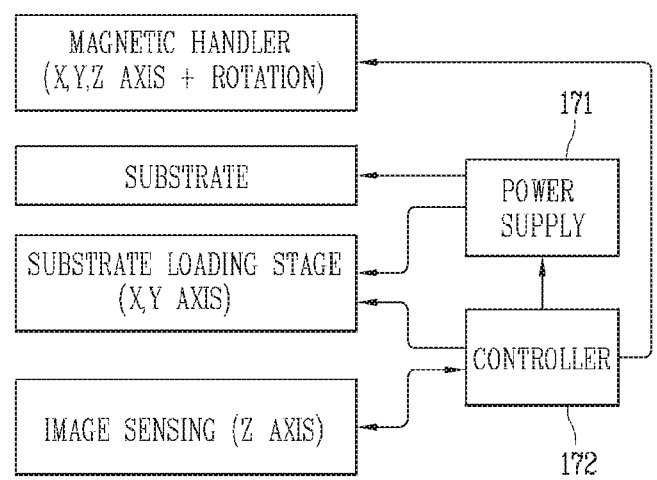
FIG. 7 is a block diagram of the self-assembly device of FIG. 6.

FIG. 6 is a conceptual diagram showing an example of a device for self-assembling semiconductor light-emitting diodes according to the present disclosure, and FIG. 7 is a block diagram of the self-assembly device of FIG. 6. FIGS. 8A to 8D are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8D. All components of the self-assembly device according to all embodiments of the present disclosure are operatively coupled and configured.

Referring to FIGS. 6 and 7, the self-assembly device 160 of the present disclosure can comprise an assembly chamber 162, magnets 163, and a position controller 164.

The assembly chamber 162 is equipped with space for a plurality of semiconductor light-emitting diodes. The space can be filled with a fluid, and the fluid can be an assembly solution, which includes water or the like. Thus, the assembly chamber 162 can be a water tank and configured as open-type. However, the present disclosure is not limited to this, and the assembly chamber 162 can be a closed-type chamber that comes with a closed space.

A substrate 161 can be placed in the assembly chamber 162 so that an assembly surface where the semiconductor light-emitting diodes 150 are assembled faces downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the assembly chamber 162. As shown in the drawings, the assembly surface of the substrate 161 is placed in such a way as to be soaked with the fluid in the assembly chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, SiNx, SiON, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by barrier walls 161e. The cells 161d can be sequentially arranged in one direction and made of polymer material. Also, the barrier walls 161e forming the cells 161d can be shared with neighboring cells 161d. The barrier walls 161e can protrude from the base portion 161a, and the cells 161d can be sequentially arranged in one direction along the barrier walls 161e. More specifically, the cells 161d can be sequentially arranged in column and row directions and have a matrix structure.

As shown in the drawings, the cells 161d can have recesses for containing the semiconductor light-emitting diodes 150, and the recesses can be spaces defined by the barrier walls 161e. The recesses can have a shape identical or similar to the shape of the semiconductor light-emitting diodes. For example, if the semiconductor light-emitting diodes are rectangular, the recesses can be rectangular too. Moreover, although not shown, the recesses formed in the cells can be circular if the semiconductor light-emitting diodes are circular. Further, each cell is configured to contain one semiconductor light-emitting diode. That is, one cell contains one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have magnets 163 for applying magnetic force to the semiconductor light-emitting diodes. The magnets 163 are placed at a distance from the assembly chamber 162 and apply a magnetic force to the semiconductor light-emitting diodes 150. The magnets 163 can be placed to face the opposite side of the assembly surface of the substrate 161, and the positions of the magnets 163 are controlled by the position controller 164 connected to the magnets 163.

The semiconductor light-emitting diodes 1050 can have a magnetic material so that they are moved within the fluid by a magnetic field.

Referring to FIG. 9, a semiconductor light-emitting diode having a magnetic material can comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1052 and where the second conductive layer 1056 is placed, and an active layer 1054 placed between the first and second conductive semiconductor layers 1053 and 1055.

Here, the first conductive can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the assembly chamber of the self-assembly device, a magnet handler capable of automatically or manually moving the magnets 163 on the x, y, and z axes or a motor capable of rotating the magnets 163 can be provided. The magnet handler and motor can constitute the position controller 164. As such, the magnets 163 can rotate in a horizontal, clockwise, or counterclockwise direction to the substrate 161.

Meanwhile, the assembly chamber 162 can be formed with a light-transmissive bottom plate 166, and the semiconductor light-emitting diodes can be placed between the bottom plate 166 and the substrate 161. An image sensor 167 can be placed opposite the bottom plate 166 so as to monitor the inside of the assembly chamber 162 through the bottom plate 166. The image sensor 167 can be controlled by a controller 172, and can come with an inverted-type lens, CCD, etc. so as to observe the assembly surface of the substrate 161.

The above-explained self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-explained self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Figure 8A:
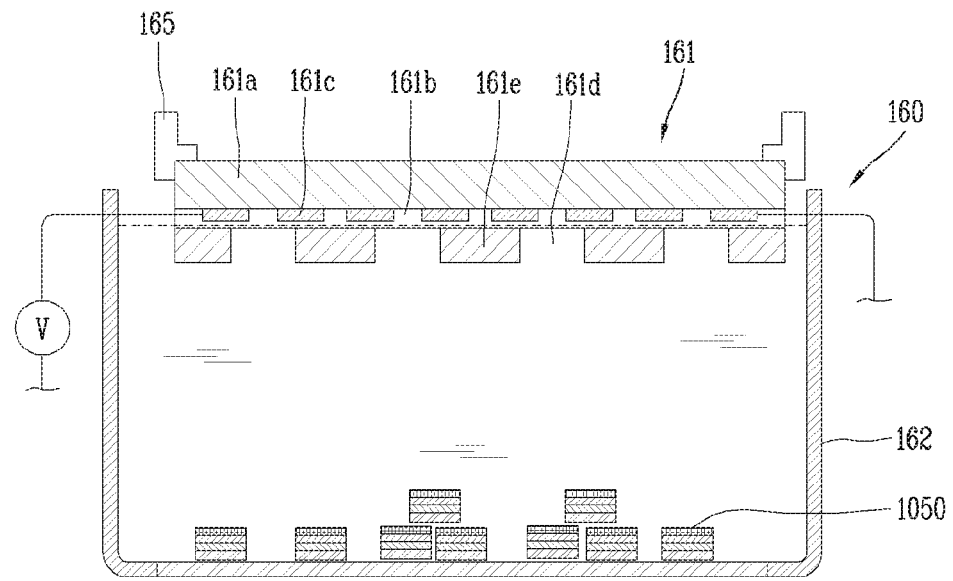
FIGS. 8A to 8E are conceptual diagrams illustrating a process for self-assembling semiconductor light-emitting diodes using the self-assembly device of FIG. 6.
Figure 9:
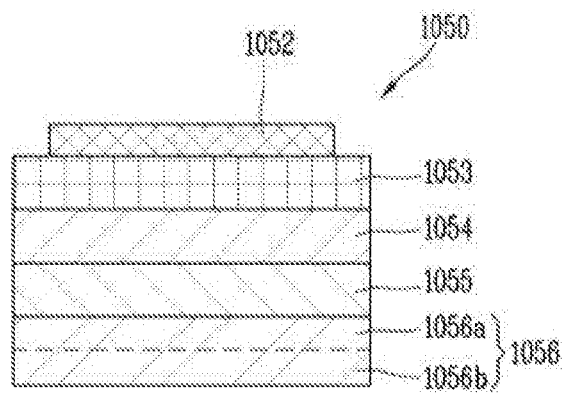
FIG. 9 is a conceptual diagram illustrating the semiconductor light-emitting diodes of FIGS. 8A to 8E.

Next, the substrate 161 is fed to an assembly site, and the semiconductor light-emitting diodes 1050 are put into the assembly chamber 162 (FIG. 8A).

As described above, the assembly site on the substrate 161 can be a position at which the substrate 161 is placed in the assembly chamber 162 in such a way that an assembly surface where the semiconductor light-emitting diodes 150 are assembled faces downwards.

In this case, some of the semiconductor light-emitting diodes 1050 can sink to the bottom of the assembly chamber 162 and some of them can float in the fluid. If the assembly chamber 162 comes with a light-transmissive bottom plate 166, some of the semiconductor light-emitting diodes 1050 can sink to the bottom plate 166.

Figure 8B:
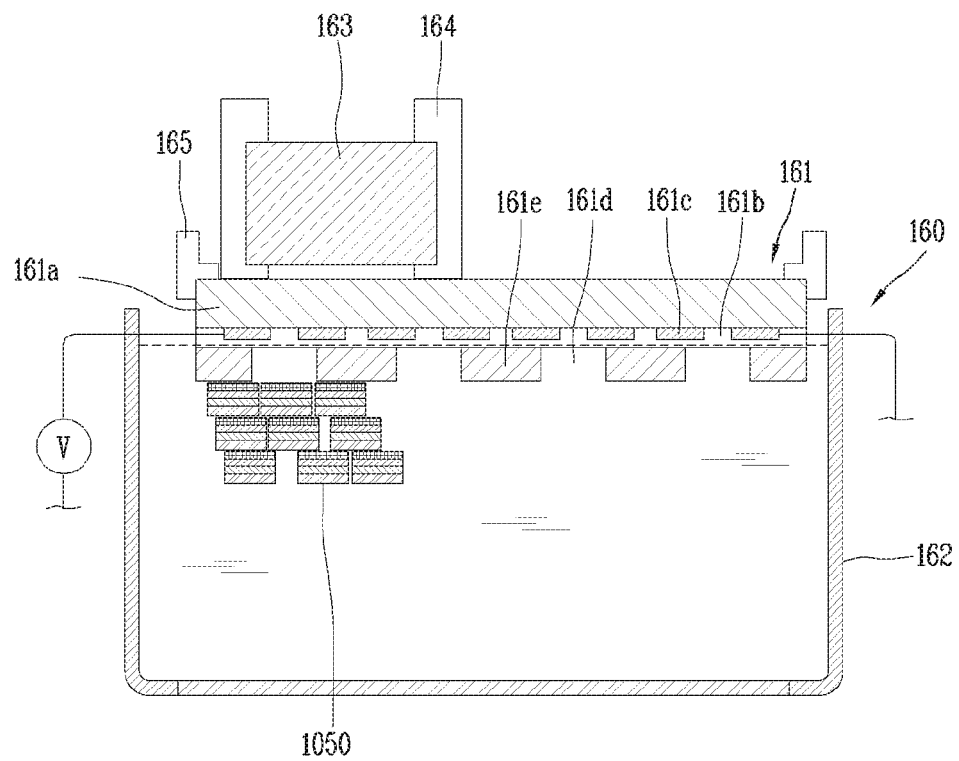

Next, a magnetic force is applied to the semiconductor light-emitting diodes 1050 so that the semiconductor light-emitting diodes 1050 in the assembly chamber 162 come up to the surface (FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions can refer to positions at which the magnets 163 are outside the assembly chamber 162. In another example, the magnets 163 can be composed of electromagnets. In this case, an initial magnetic force is generated by supplying electricity to the electromagnets.

Meanwhile, in this embodiment, the spacing between the assembly surface of the substrate 161 and the semiconductor light-emitting diodes 1050 can be controlled by adjusting the strength of the magnetic force. For example, the spacing is controlled by using the weight, buoyancy, and magnetic force of the semiconductor light-emitting diodes 1050. The spacing can be several millimeters to several tens of micrometers from the outermost part of the substrate 161.

Figure 8C:
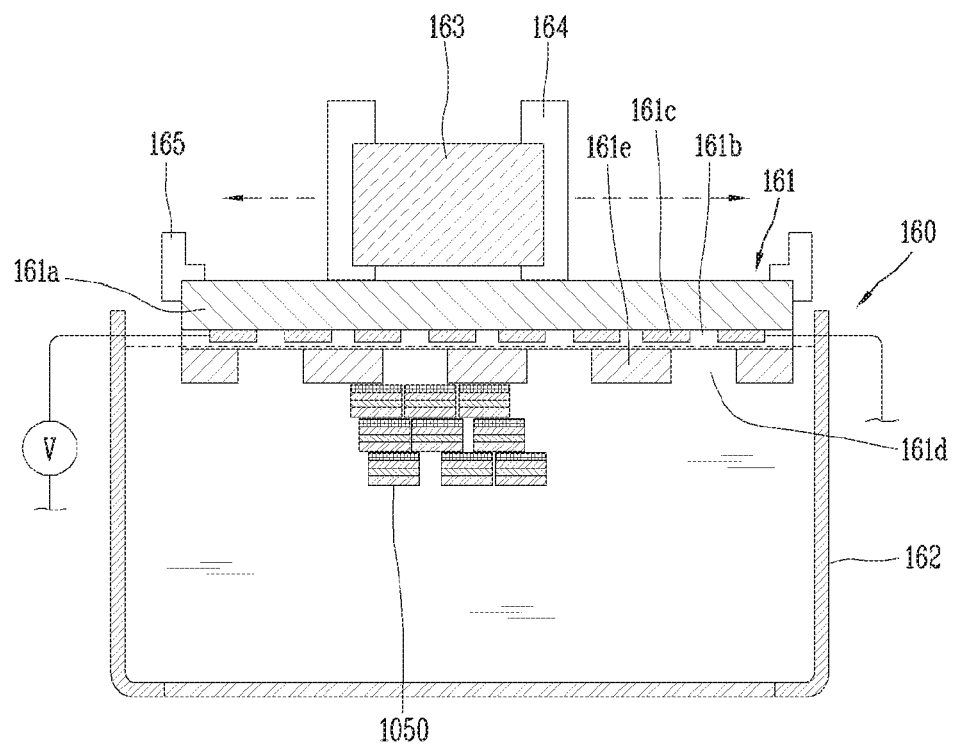

Next, a magnetic force is applied to the semiconductor light-emitting diodes 1050 so that the semiconductor light-emitting diodes 1050 move in one direction within the assembly chamber 162. For example, the magnets 163 can move in a horizontal, clockwise, or counterclockwise direction to the substrate 161 (FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Figure 8D:
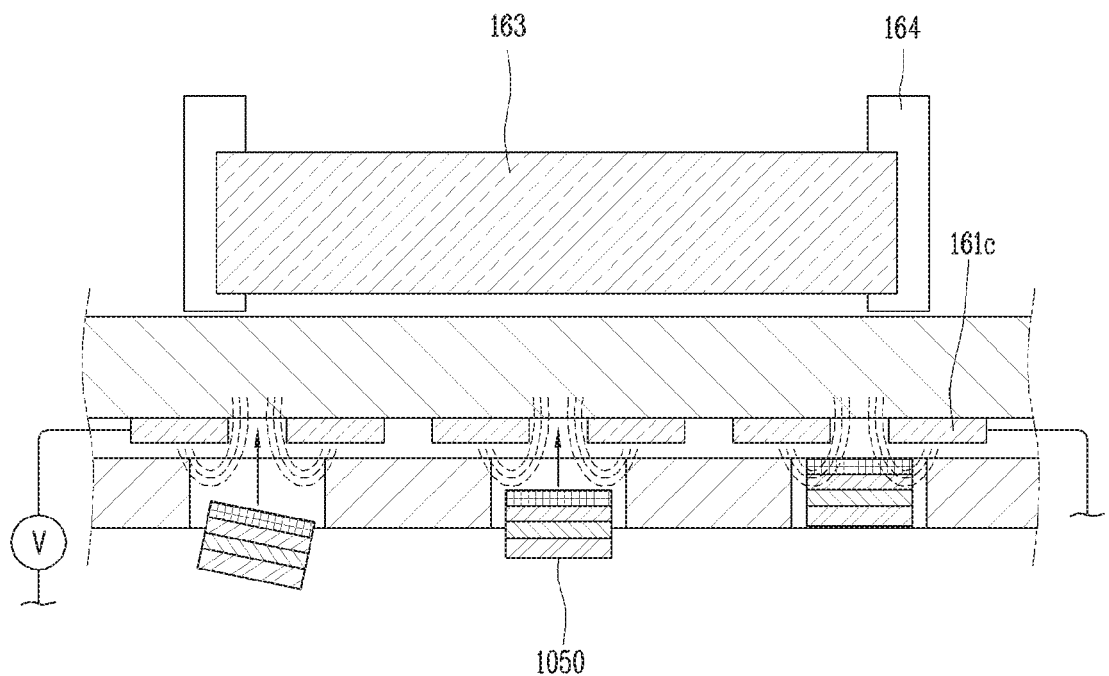
Figure 8E:
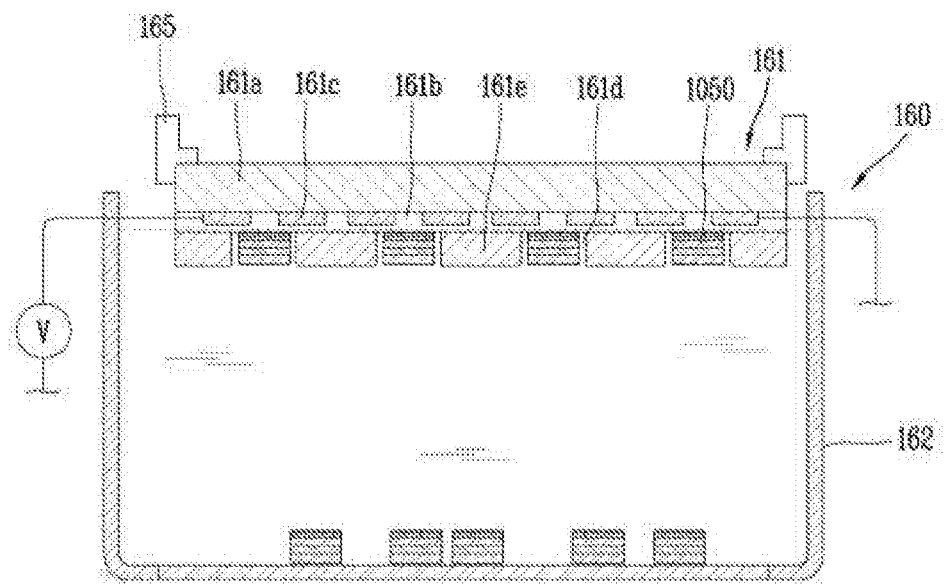

Meanwhile, after the semiconductor light-emitting diodes 1050 are guided to the preset positions, the magnets 163 can be moved in a direction in which they get farther away from the substrate 161, so that the semiconductor light-emitting diodes 1050 remaining in the assembly chamber 162 fall to the bottom of the assembly chamber 162 (FIG. 8D). In another example, if power supply is stopped in a case where the magnets 163 are electromagnets, the semiconductor light-emitting diodes 1050 remaining in the assembly chamber 162 fall to the bottom of the assembly chamber 162.

Thereafter, the semiconductor light-emitting diodes 1050 on the bottom of the assembly chamber 162 can be collected, and the collected semiconductor light-emitting diodes 1050 can be re-used.

In the above-explained self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects. That is, the assembly substrate is placed on the top to increase transfer yields, thus minimizing the effect of gravity or friction and avoiding non-specific binding.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

When the self-assembly process described above is performed, several problems occur.

Firstly, as an area of the display increases, an area of the assembly substrate increases. As the area of the assembly substrate increases, there is a problem that a warpage phenomenon of the substrate increases. When self-assembly is performed in a state in which the assembly substrate is warped, since the magnetic field is not uniformly formed at the surface of the assembly substrate, it is difficult to perform the self-assembly stably.

Secondly, since the semiconductor light-emitting diodes may not be completely uniformly dispersed in the fluid and the magnetic field formed at the surface of the assembly substrate may not be uniform completely, a problem that the semiconductor light-emitting diodes are concentrated only at a partial region of the assembly substrate can occur.

The present disclosure provides a self-assembly device capable of solving the above-described problems and increasing a self-assembly yield.

The self-assembly device according to the present disclosure can include a substrate surface treatment part, a substrate chuck 200, a magnetic field forming part 300, a chip supply part 400, and an assembly chamber 500. However, the present disclosure is not limited thereto, and the self-assembly device according to the present disclosure can include more or less components than those described above.

Prior to describing the self-assembly device according to the present disclosure, a self-assembling method using the self-assembly device according to the present disclosure will be described briefly.

Figure 10:
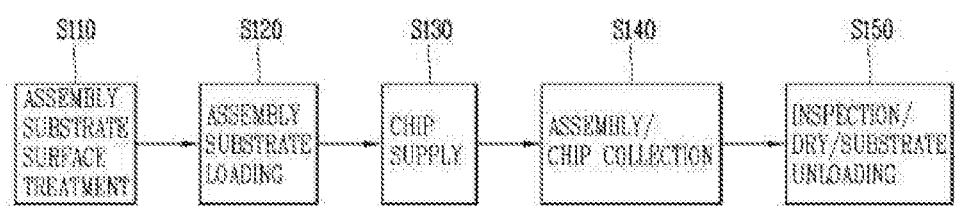
FIG. 10 is a flowchart illustrating a self-assembling method in accordance with the present disclosure.

FIG. 10 is a flowchart illustrating a self-assembling method in accordance with the present disclosure.

First, a surface treatment step S110 of an assembly substrate is performed. The step is not essential, but when a surface of the substrate is hydrophilized, it is possible to prevent bubbles from being generated on the surface of the substrate.

Next, a step S120 of loading the assembly substrate onto the substrate chuck is performed. The assembly substrate loaded on the substrate chuck 200 is transferred to an assembly position of the assembly chamber. Thereafter, the magnetic field forming part approaches the assembly substrate through vertical and horizontal movements.

In such a state, a step S130 of supplying a chip is performed. Specifically, a step of dispersing the semiconductor light-emitting diodes on the assembly surface of the assembly substrate is performed. When the semiconductor light-emitting diodes are dispersed near the assembly surface in a state in which the magnetic field forming part 300 is close enough to the assembly substrate, the semiconductor light-emitting diodes adhere to the assembly surface by the magnetic field forming part. The semiconductor light-emitting diodes are dispersed onto the assembly surface at an appropriate dispersion.

However, the present disclosure is not limited thereto, and the semiconductor light-emitting diodes can be dispersed into the fluid in the assembly chamber before the substrate is transferred to the assembly position. That is, a time point at which the chip supply step S130 is performed is not limited to after the assembly substrate is transferred to the assembly position.

A method of supplying the semiconductor light-emitting diode can vary according to an area of the assembly substrate, a type of the semiconductor light-emitting diode to be assembled, and a self-assembly speed.

Thereafter, a step S140 of performing the self-assembly and collecting the semiconductor light-emitting diodes is performed. The self-assembly will be described later together with a description of a self-assembly device according to the present disclosure. Meanwhile, the semiconductor light-emitting diodes are not necessarily collected after the self-assembly. After the self-assembly is completed, the semiconductor light-emitting diode in the assembly chamber is replenished, and then a new substrate can be self-assembled.

Lastly, after the self-assembly is completed, a step S150 of inspecting and drying the assembly substrate, and separating the substrate from the substrate chuck can be performed. The inspection of the assembly substrate can be performed at the position at which the self-assembly has been performed, and can be performed after the assembly substrate is transferred to another position.

Meanwhile, the drying of the assembly substrate can be performed after the assembly substrate is separated from the fluid. After the drying of the assembly substrate, a post process of the self-assembly can be performed.

Contents of a basic principle of the self-assembly, a structure of the substrate (or assembly substrate), and the semiconductor light-emitting diode are replaced with those described in FIGS. 1 to 9. Meanwhile, since a vertical moving part, a horizontal moving part, a rotating part, and other moving components described below can be implemented through several known components such as a motor and a ball screw, a rack gear and a pinion gear, and a pulley and a timing belt, and the like, detailed descriptions thereof will be omitted.

Meanwhile, the controller 172 described in FIG. 7 controls movements of the vertical moving part, the horizontal moving part, the rotating part, and other moving components provided in the above-described components. That is, the controller 172 is configured to control movements of x, y, and z axes and a rotating movement of each component. Even though not mentioned separately in the specification, the movements of the vertical moving part, the horizontal moving part, the rotating part, and other moving components are caused by the control of the controller 172.

Meanwhile, the electrode 161c provided at the substrate (or assembly substrate 161) described in FIGS. 6 to 9 is referred to as an assembly electrode, the assembly electrode 161c is electrically connected to the power supply 171 described in FIG. 7 via the substrate chuck 200, and the power supply 171 supplies power to the assembly electrode 161c by the control of the controller 172. Detailed description thereof will be described later.

Hereinafter, the above-described components will be described.

First, a substrate surface treatment part serves to hydrophilize a substrate surface. Specifically, the self-assembly device according to the present disclosure performs a self-assembly in a state in which the assembly substrate is in contact with a fluid surface. When the assembly surface of the assembly substrate has a heterogeneous property with the fluid surface, bubbles and the like can be generated on the assembly surface, and non-specific coupling between the semiconductor light-emitting diode and the assembly surface can occur. To prevent this, the substrate surface can be treated with fluid-friendly properties before the self-assembly.

In one embodiment, when the fluid is a polar material such as water, the substrate surface treatment part can hydrophilize the assembly surface of the substrate.

For example, the substrate surface treatment part can include a plasma generator. Hydrophilic functional groups can be formed at the substrate surface by plasma treatment of the substrate surface. Specifically, the hydrophilic functional groups can be formed at at least one of a partition wall and a dielectric layer provided at the substrate by the plasma treatment.

Meanwhile, different surface treatments can be performed at a partition wall surface and a surface of the dielectric layer exposed to outside by a cell so as to prevent non-specific coupling of the semiconductor light-emitting diode. For example, a hydrophilic treatment can be performed at the surface of the dielectric layer exposed to the outside by the cell, and a surface treatment can be performed to form hydrophobic functional groups at the surface of the partition wall. Accordingly, non-specific coupling of the semiconductor light-emitting diode with respect to the surface of the partition wall can be prevented, and the semiconductor light-emitting diode can be strongly fixed inside the cell.

However, the substrate surface treatment part is not an essential component in the self-assembly device according to the present disclosure. The substrate surface treatment part may not be necessary depending on a material configuring the substrate.

The substrate at which the surface treatment is completed by the substrate surface treatment part is loaded onto a substrate chuck 200.

Next, the substrate chuck 200 will be described.

Figure 11:
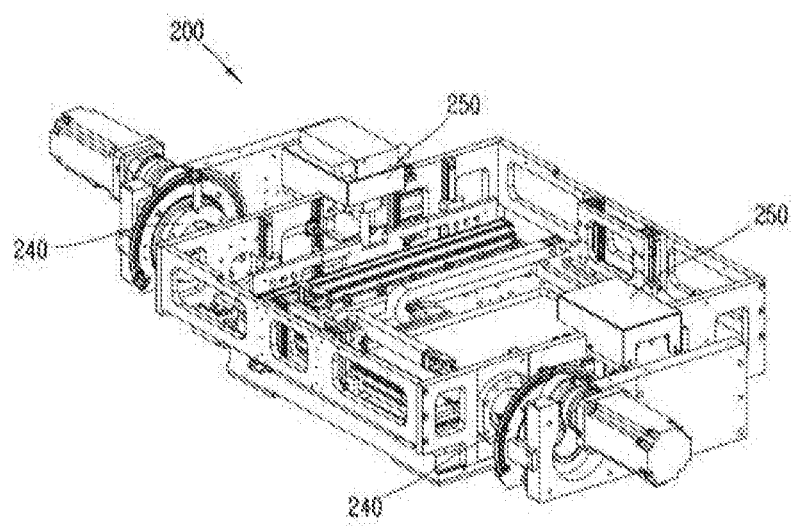
FIG. 11 is a conceptual diagram illustrating a first state of a substrate chuck.
Figure 12:
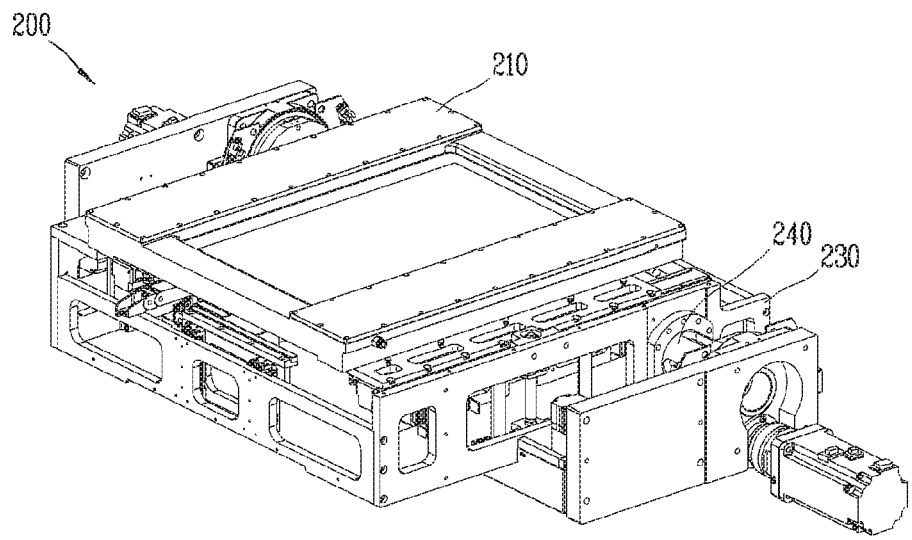
FIG. 12 is a conceptual diagram illustrating a second state of the substrate chuck.
Figure 13:
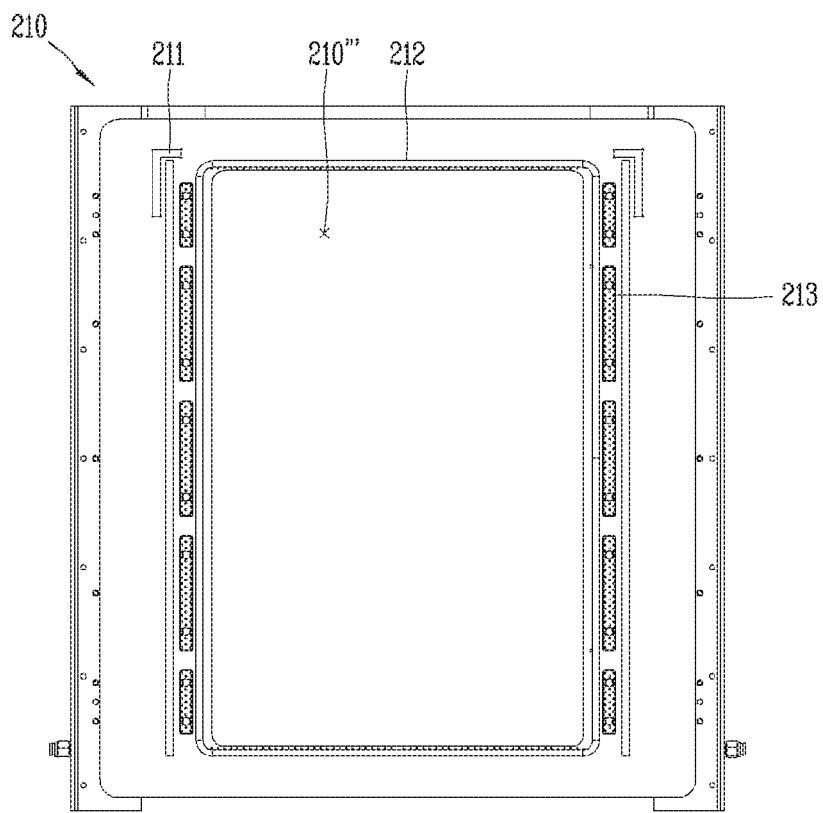
FIG. 13 is a planar view of a first frame provided at the substrate chuck.
Figure 14:
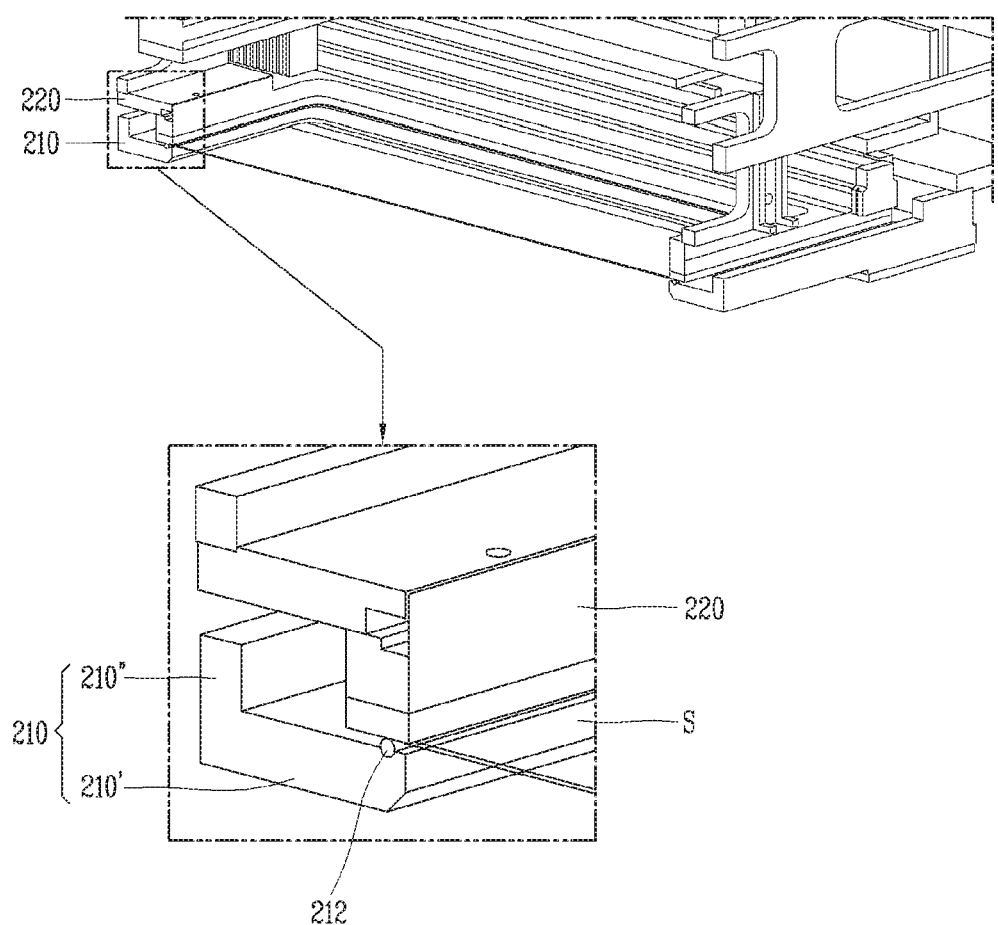
FIG. 14 is a conceptual diagram illustrating a state in which an assembly substrate is loaded on a substrate chuck.

FIG. 11 is a conceptual diagram illustrating a first state of a substrate chuck, FIG. 12 is a conceptual diagram illustrating a second state of the substrate chuck, FIG. 13 is a planar view of a first frame provided at the substrate chuck, and FIG. 14 is a conceptual diagram illustrating a state in which an assembly substrate is loaded at the substrate chuck. All components of the substrate chuck according to all embodiments of the present disclosure are operatively coupled and configured.

Referring to the accompanying drawings, the substrate chuck 200 includes a substrate support part. In one embodiment, the substrate support part includes first and second frames 210 and 220 and a fixing part 230. The first and second frames 210 and 220 are disposed at upper and lower sides of the loaded substrate interposed therebetween, and the fixing part 230 supports the first and second frames 210 and 220. The substrate chuck 200 can include all of a rotating part 240, a vertical moving part 250, and a horizontal moving part 250. As illustrated in FIG. 11, the vertical moving part 250 and the horizontal moving part 250 can be configured as one device. Meanwhile, the present disclosure is not limited to drawings described below, and the rotating part, the vertical and horizontal moving parts provided at the substrate chuck can be configured as one device.

In this specification, the first frame 210 is defined as a frame disposed at a lower side of the substrate in a state in which an assembly surface of the substrate S faces a fluid, and the second frame 220 is defined as a frame disposed at a upper side of the substrate in a state in which the assembly surface of the substrate faces the fluid. The upper and lower sides between the first frame 210 and the second frame 220 can be switched with each other due to the rotating part 240. In this specification, a state in which the first frame 210 is under the second frame 220 is defined as a first state (see FIG. 11), and a state in which the first frame 210 is over the second frame 220 is defined as a second state (see FIG. 12). The rotating part 240 rotates at least one of the first and second frames 210 and 220 and the fixing part 230 to switch from any one of the first and second states to the other. The rotating part 240 will be described later.

The first frame 210 is a frame in contact with the fluid filled in the assembly chamber during self-assembly. Referring to FIG. 14, the first frame 210 includes a bottom portion 210' and a sidewall portion 210".

The bottom portion 210' serves to support the substrate at the lower side or the upper side of the substrate S when the substrate S is loaded. The bottom portion 210' can be formed in one plate shape, or can be formed in a form in which a plurality of members forming a plate shape are coupled to each other. Referring to FIG. 13, the bottom portion 210' includes a hole 210''' passing through a central portion. The hole 210''' can expose a substrate which will be described later to the outside to be in contact with the fluid. That is, the hole 210''' defines the assembly surface of the substrate. The substrate is loaded such that four corners of the rectangular substrate are mounted on an edge of the hole 210''' of the first frame 210. Accordingly, a remaining region except for the edge of the substrate overlaps the hole 210''' provided at the first frame 210. The region of the substrate overlapped with the hole 210''' becomes an assembly surface.

Meanwhile, a sealing part 212 and an electrode connection part 213 can be disposed at the edge of the hole 210'''.

The sealing part 212 is in close contact with the substrate to prevent the fluid filled in the assembly chamber from penetrating into the first and second frames 210 and 220 during self-assembly. In addition, the sealing part 212 prevents the fluid from penetrating into the assembly electrode 161c and the electrode connection part 213. For this, the sealing part 212 should be disposed at a position closer to the hole 210''' than the electrode connection part 213.

The sealing part 212 is formed in a ring shape, and a material of the sealing part 212 is not particularly limited. The material forming the sealing part 212 can be a known sealing material. However, the sealing part 212 should be made of a material that is not attached or is adhesive to the substrate. The sealing part 212 is in close contact with the substrate when the substrate is loaded, and is separated from the substrate when the substrate is unloaded. At this time, the sealing part 212 should not be attached to the substrate.

The electrode connection part 213 is connected to the assembly electrode formed at the substrate to supply power to the assembly electrode. In one embodiment, the electrode connection part 213 can apply power supplied from the power supply 171 described in FIG. 7 to the assembly electrode 161c to form an electric field on the substrate.

Meanwhile, the sidewall portion 210" is formed at an edge of the bottom portion 210'. The sidewall portion 210" prevents the fluid from penetrating into an opposite surface of the assembly surface of the substrate during self-assembly. Specifically, the self-assembly device according to the present disclosure performs self-assembly in a state in which the substrate is submerged in the fluid. The sidewall portion 210" prevents the fluid from penetrating into the opposite surface of the assembly surface of the substrate when the substrate is submerged in the fluid.

For this, the sidewall portion 210" is formed to surround an entire edge of the substrate. A height of the sidewall portion 210" should be greater than a depth at which the substrate is submerged in the fluid. The sidewall portion 210" prevents the fluid from penetrating into the opposite surface of the assembly surface of the substrate, and thus the substrate is prevented from being damaged, and buoyancy of the fluid is applied to only one surface of the substrate. This will be described later.

Meanwhile, in order to prevent the fluid from penetrating into the opposite surface of the assembly surface of the substrate, the sidewall portion 210" provided at the first frame can surround the second frame 220 in a state in which the second frame 220 presses the substrate. Accordingly, the sidewall portion 210" can prevent the fluid from penetrating into the opposite surface of the assembly surface of the substrate.

Meanwhile, the second frame 220 serves to press the substrate at the opposite side of the first frame 210 during self-assembly. Like the first frame 210, the second frame 220 includes a hole passing through a central portion. The hole formed at the second frame 220 has a size equal to or larger than the hole 210''' formed at the first frame 210.

The hole formed at the second frame 220 allows the opposite surface of the assembly surface of the substrate to be exposed to the outside. The opposite surface of the assembly surface of the substrate should be exposed to the outside in the same area as the assembly surface or in a larger area than the assembly surface. This is because the magnetic field forming part 300 forms a magnetic field at the opposite side of the assembly surface of the substrate. The opposite surface of the assembly surface of the substrate should be exposed to the outside such that the magnetic field forming part 300 can sufficiently approach the substrate.

Meanwhile, the substrate S is loaded between the first and second frames 210 and 220 in the second state. Accordingly, the substrate S is slid and loaded at one surface of the second frame 220. A protrusion for guiding an alignment position of the substrate can be formed at at least one of the first and second frames such that the substrate is aligned to a correct position. In one embodiment, referring to FIG. 13, protrusions 211 guiding the alignment position of the substrate S can be formed at the first frame 210.

Meanwhile, when the substrate S is loaded on the second frame 220, at least one of the first and second frames 210 and 220 moves vertically such that the first and second frames 210 and 220 press the substrate. For this, the substrate chuck 200 can include a frame moving part disposed at at least one of the fixing part 230, and the first and second frames 210 and 220. At this time, the sealing part 212 presses the substrate S.

In one embodiment, a frame moving part for vertically moving the second frame 220 can be disposed at the fixing part 230. While the substrate chuck is in the second state, when the substrate S is loaded on the second frame 220, the vertical moving part moves the second frame 220 upwardly such that the substrate S can be strongly fixed between the first and second frames 210 and 220. At this time, the electrode connection part 213 provided at the first frame 210 is connected to the assembly electrode of the substrate S, and the sealing part 212 provided at the first frame 210 presses the edge of the substrate S. In this state, when the substrate chuck switches to the first state, the substrate chuck has a shape as shown in FIG. 14.

In one embodiment, the frame moving part can have a variable length so as to connect the fixing part and the second frame and allow for vertical movement of the second frame. To this end, the frame moving part can be a linear motor, but is not limited thereto.

However, the present disclosure is not limited thereto, and the frame moving part can be configured to move any one of the first and second frames 210 and 220 horizontally with respect to the other. In this case, the frame moving part is configured to move any one of the first and second frames 210 and 220 vertically and horizontally with respect to the other. When any one of the first and second frames 210 and 220 can be moved horizontally with respect to the other, a connection portion between the electrode connection part 213 and the assembly electrode can be changed. It can be used to detect whether the assembled electrode is defective.

Meanwhile, the rotating part 240 is disposed at one side of the fixing part 230 provided at the substrate chuck 200 described above. The rotating part 240 rotates the fixing part 230 such that the upper and lower-sides relation of the first and second frames 210 and 220 can be switched to each other. The substrate chuck 200 is switched from any one of the first and second states to the other by rotating movement of the rotating part 240. A rotation speed, a degree of rotation, a rotation direction, and the like of the rotating part 240 can be controlled by the controller 172 described in FIG. 7.

In one embodiment, the substrate chuck 200 is in the second state before the substrate S is loaded, and the controller 172 controls the rotating part 240 to rotate the fixing part 230 to 180 degrees after the substrate S is loaded such that the substrate chuck 200 is switched to the first state.

Meanwhile, a vertical moving part and a horizontal moving part are disposed at one side of the fixing part 230.

The horizontal moving part moves at least one of the fixing part 230, and the first and second frames 210 and 220 such that the assembly surface of the substrate can be aligned at an open position of the assembly chamber after the substrate is loaded.

The vertical moving part moves at least one of the fixing part 230, and the first and second frames 210 and 220 such that a vertical distance between the substrate and the assembly chamber is adjusted. A warpage phenomenon of the substrate S can be corrected by the vertical moving part. This will be described later.

In summary, the substrate S is loaded in the second state of the substrate chuck 200 (see FIG. 12). Thereafter, the substrate chuck 200 is switched to the first state (see FIG. 11) and then aligned with the assembly chamber. In this process, the substrate chuck 200 moves vertically and horizontally such that the assembly surface of the substrate S is in contact with the fluid filled in the assembly chamber. Thereafter, the controller 172 controls the magnetic field forming part 300.

Next, the magnetic field forming part 300 will be described.

Figure 15:
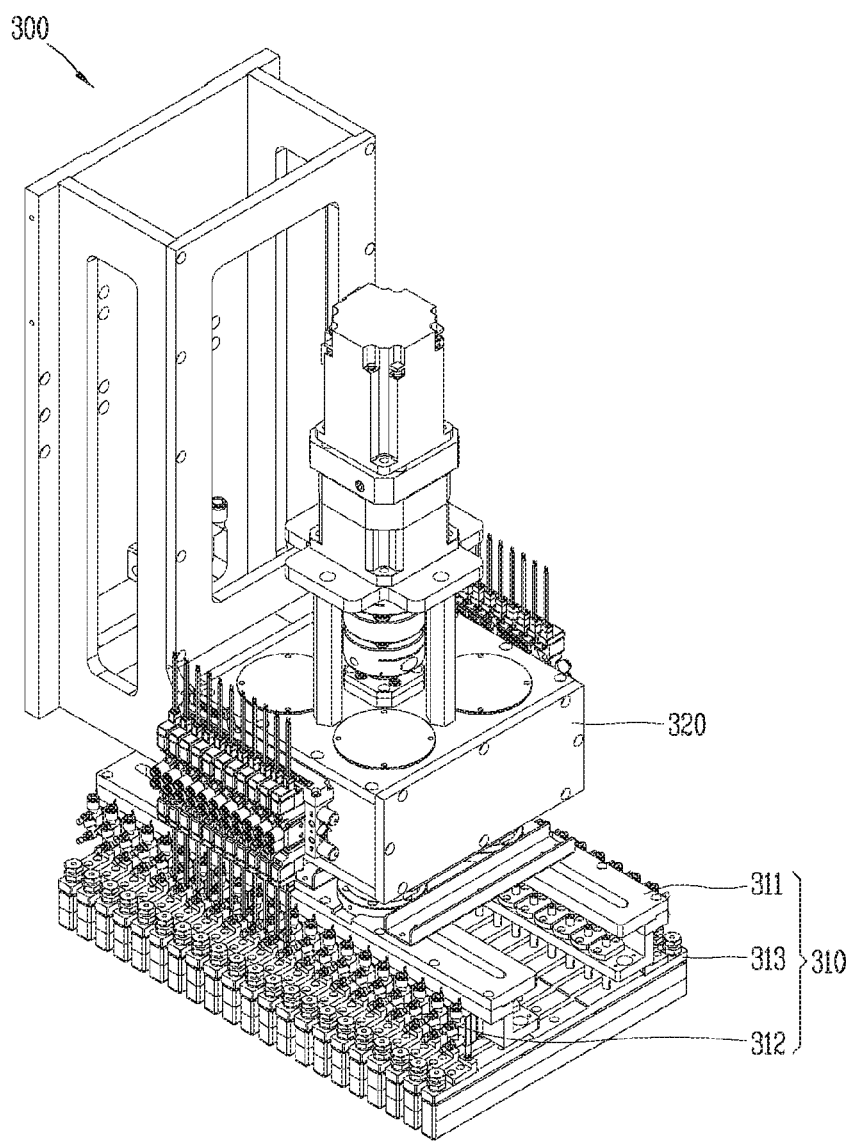
FIG. 15 is a perspective view of a magnetic field forming part in accordance with one embodiment of the present disclosure.
Figure 16:
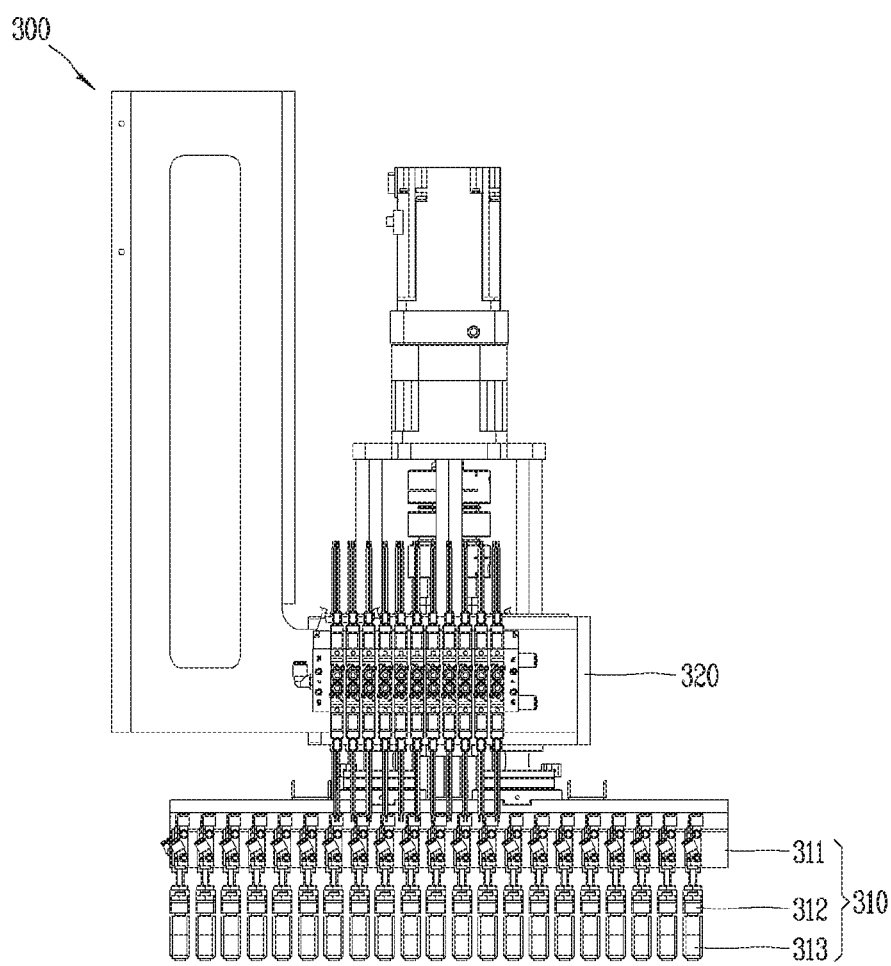
FIG. 16 is a diagram illustrating one side of a magnetic field forming part in accordance with one embodiment of the present disclosure.
Figure 17:
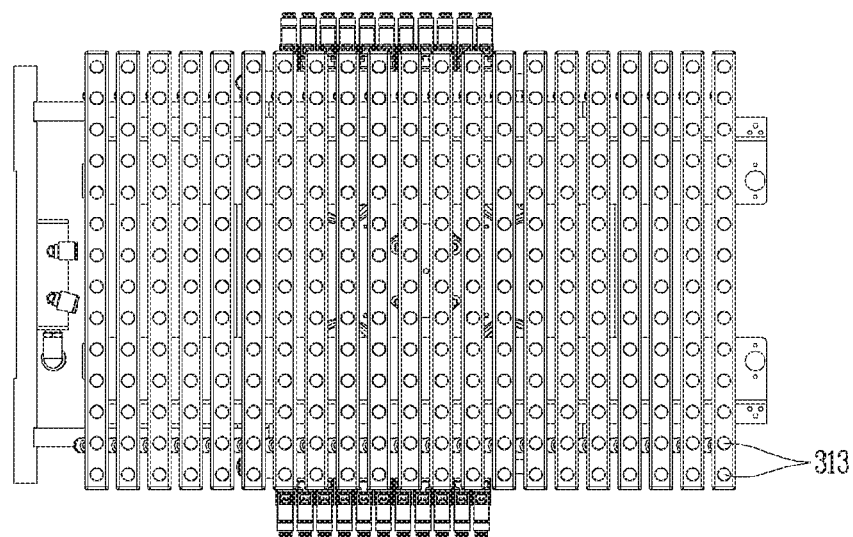
FIG. 17 is a diagram illustrating a lower side of a magnetic field forming part in accordance with one embodiment of the present disclosure.
Figure 18:
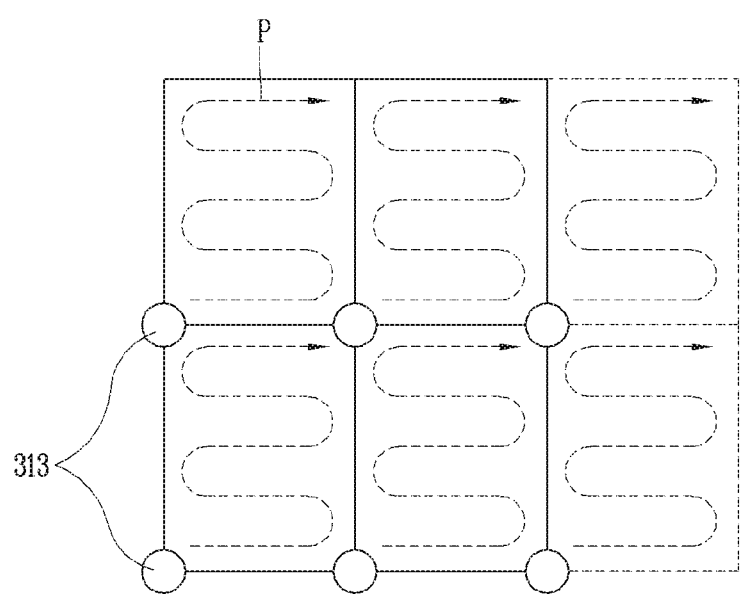
FIG. 18 is a conceptual diagram illustrating a trajectory of magnets provided at a magnetic field forming part in accordance with the present disclosure.

FIG. 15 is a perspective view of a magnetic field forming part according to one embodiment of the present disclosure, FIG. 16 is one side view of a magnetic field forming part according to one embodiment of the present disclosure, FIG. 17 is a bottom side view of a magnetic field forming part according to one embodiment of the present disclosure, and FIG. 18 is a conceptual diagram illustrating a trajectory of magnets provided at a magnetic field forming part according to the present disclosure.

Referring to the drawings, the magnetic field forming part 300 includes a magnet array 310, a vertical moving part 320, a horizontal moving part 320, and a rotating part 320. The magnetic field forming part 300 is disposed at an upper side of the assembly electrode to serve to form a magnetic field.

Specifically, the magnet array 310 includes a plurality of magnets 313. The magnet 313 provided at the magnet array 310 can be a permanent magnet or an electromagnet. The magnets 313 serves to form a magnetic field so that the semiconductor light-emitting diodes are led to the assembly surface of the substrate.

The magnet array 310 can include a support part 311 and a magnet moving part 312. The support part 311 is connected to the vertical moving part 320 and the horizontal moving part 320.

Meanwhile, one end of the magnet moving part 312 is fixed to the support part 311, and the magnet 313 is fixed to the other end of the magnet moving part 312. The magnet moving part 312 is stretchable in length, and as the magnet moving part 312 is stretched, a distance between the magnet 313 and the support part 311 changes.

As shown in the accompanying drawings, the magnet moving part 312 can be configured to vertically move the magnets 313 disposed in one row at a time. In this case, the magnet moving part 312 can be disposed for each column of the magnet array.

On the other hand, the magnet moving part 312 can be disposed by the number of magnets provided in the magnet array. Accordingly, a distance between each of a plurality of magnets and the support part can be adjusted differently.

The plurality of magnet moving parts serves to adjust finely a gap between the magnet 313 and the substrate S, and when the substrate is warped, serves to adjust uniformly the gaps between the magnets 313 and the substrate S. Self-assembly can be performed in a state in which the magnet 313 is in contact with the substrate S, or can be performed in a state in which the magnet 313 is spaced apart from the substrate S at a predetermined distance.

Meanwhile, the horizontal moving part can include a rotating part. When the self-assembly is performed, the horizontal moving part provided at the magnetic field forming part 300 moves the magnet in one direction and rotates the magnet, simultaneously. Accordingly, the magnet array 310 rotates with respect to a predetermined rotation axis and moves along one direction, simultaneously. For example, referring to FIG. 18, the magnet 313 provided at the magnet array 310 can move while drawing a trajectory P mixed with a curved line and a straight line.

The semiconductor light-emitting diode can be supplied in a state in which the magnetic field forming part 300 is close to the substrate S within a predetermined distance.

Figure 19:
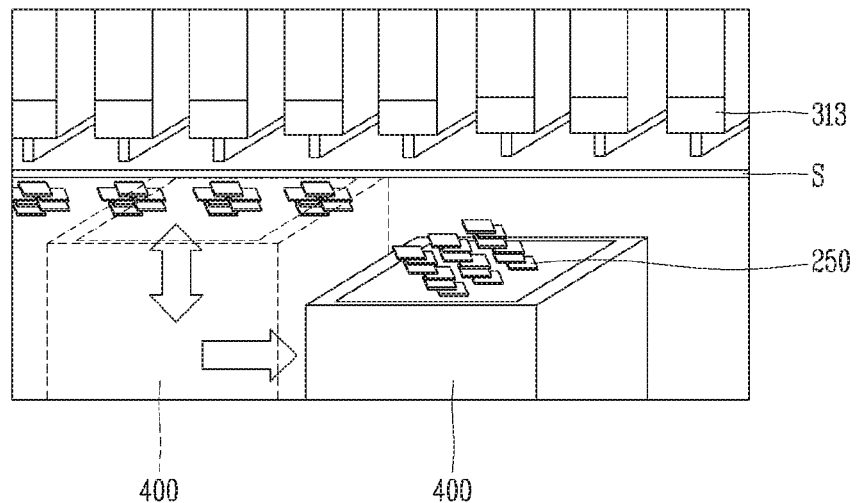
FIG. 19 is a conceptual diagram illustrating a state in which a semiconductor light emitting diode is supplied.

FIG. 19 is a conceptual diagram illustrating a state in which a semiconductor light emitting diode is supplied.

Referring to FIG. 19, a chip supply part 400 can be disposed in an assembly chamber 500 to be described later. The substrate S is aligned with the assembly chamber 500, and then the chip supply part 400 serves to supply the semiconductor light-emitting diode to the assembly surface of the substrate S. Specifically, the chip supply part 400 can include a chip accommodating part that can accommodate a chip at an upper portion thereof, a vertical moving part, and a horizontal moving part. The vertical and horizontal moving parts allow the chip accommodating part to move in the fluid filled in the assembly chamber.

The plurality of semiconductor light-emitting diodes can be loaded at the chip accommodating part. After the substrate is aligned with the assembly chamber, when the magnetic field forming part 300 is brought close to the substrate within a predetermined distance, a magnetic field of a predetermined intensity or more is formed on the assembly surface. In this state, when the chip accommodating part is brought close to the assembly surface within the predetermined distance, the semiconductor light-emitting diodes loaded at the chip accommodating part are in contact with the substrate. The vertical moving part provided at the chip supply part brings the chip accommodating part close to a partial region of the assembly surface of the substrate within the predetermined distance through vertical movement.

After a predetermined time elapses, the vertical moving part provided at the chip supply part allows the chip accommodating part to be separated from the partial region of the assembly surface of the substrate at the predetermined distance or longer through vertical movement. Thereafter, the horizontal moving part provided at the chip supply part moves horizontally the chip accommodating part such that the chip accommodating part overlaps a different region from the partial region of the assembly surface. Thereafter, the vertical moving part provided at the chip supply part brings the chip accommodating part close to the different region within the predetermined distance through vertical movement. By repeating such a process, the chip supply part brings the plurality of semiconductor light-emitting diodes into contact with an entire region of the assembly surface of the substrate. Self-assembly can be performed in a state in which the plurality of semiconductor light-emitting diodes are constantly dispersed and in contact with the entire region of the assembly surface of the substrate.

As described above, there are largely two problems in self-assembly. A second problem is that since the semiconductor light-emitting diodes may not be completely uniformly dispersed in the fluid and the magnetic field formed at the surface of the assembly substrate may not be perfectly uniform, there is a problem that the semiconductor light-emitting diodes are concentrated only at a partial region of the assembly substrate. When using the chip supply part 400 described above, it is possible to solve the second problem described above.

However, the present disclosure is not limited thereto, and the chip supply unit is not an essential component of the present disclosure. Self-assembly can be performed in a state in which the semiconductor light-emitting diode is dispersed in the fluid, or in a state in which the plurality of semiconductor light-emitting diodes are dispersed and in contact with the assembly surface of the substrate by another part which is not the chip supply part.

Next, the assembly chamber 500 will be described.

Figure 20:
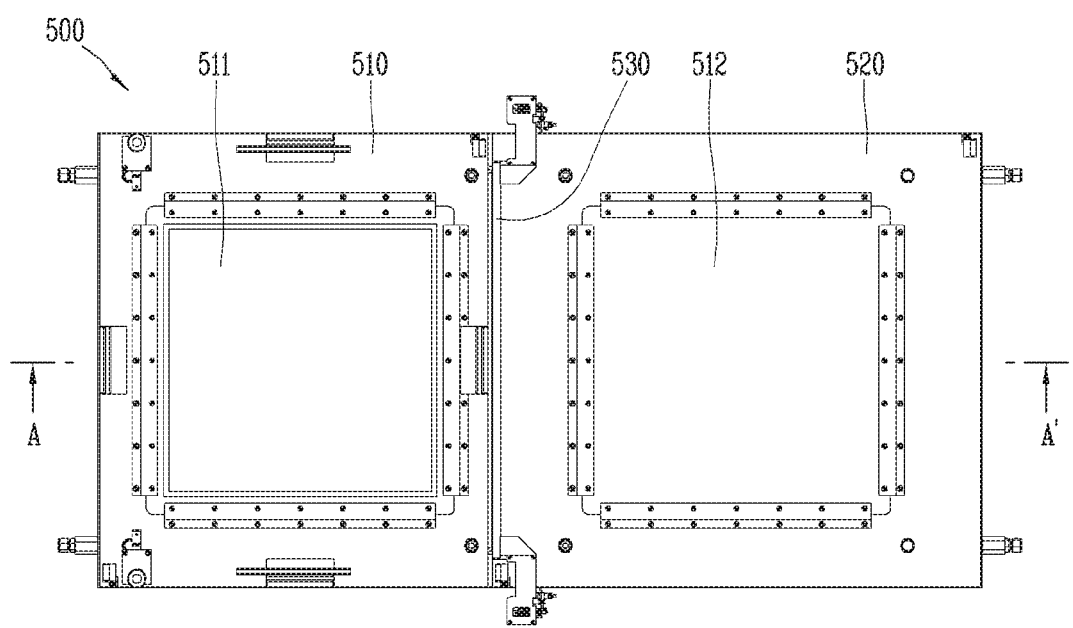
FIG. 20 is a planar view of an assembly chamber in accordance with one embodiment of the present disclosure.
Figure 21:
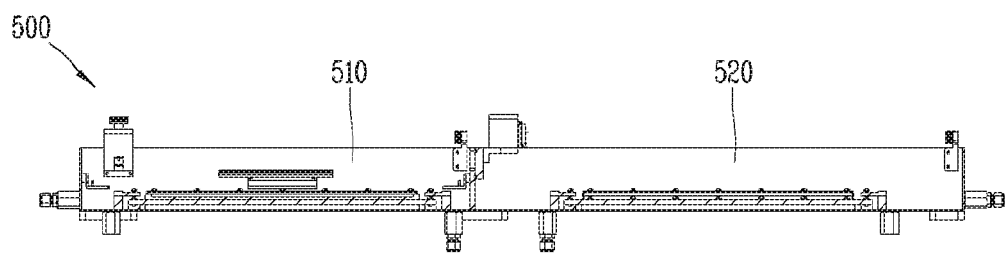
FIG. 21 is a cross-sectional view taken along the line A-A' of FIG. 20.
Figure 22:
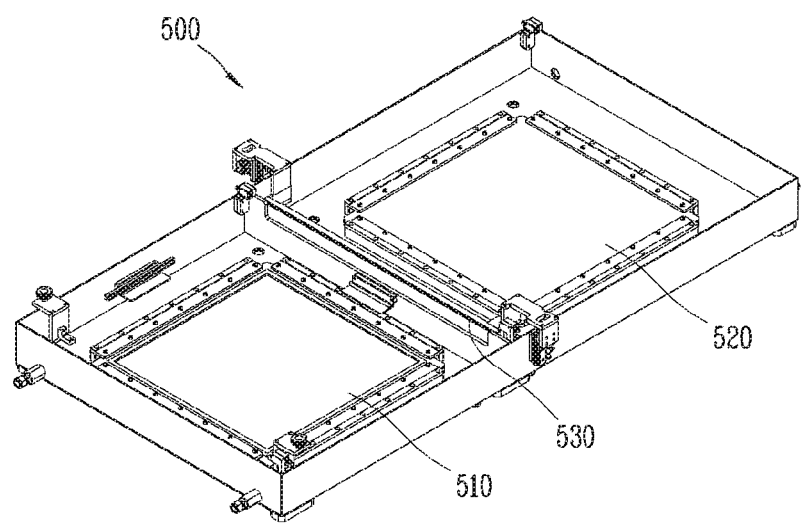
FIGS. 22 and 23 are conceptual diagrams illustrating movement of a gate provided at an assembly chamber according to one embodiment of the present disclosure.
Figure 23:
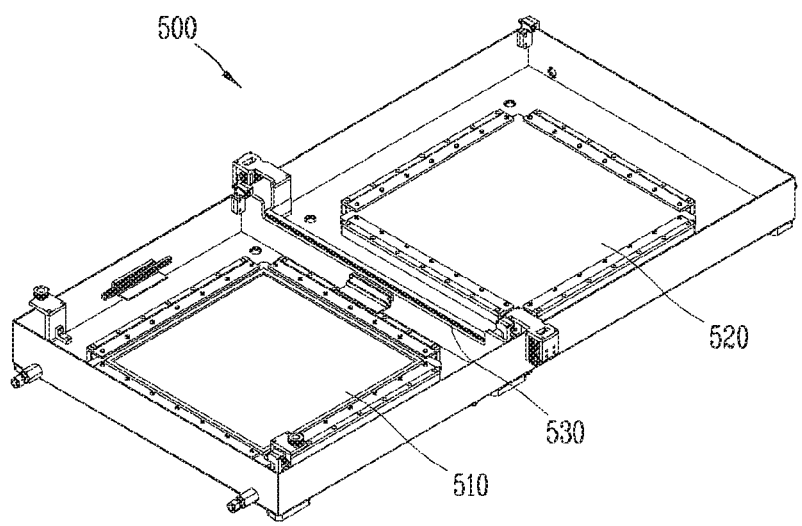

FIG. 20 is a planar view of an assembly chamber according to one embodiment of the present disclosure, FIG. 21 is a cross-sectional view taken along line A-A' of FIG. 20, and FIGS. 22 and 23 are conceptual diagrams illustrating a movement of a gate provided at an assembly chamber according to one embodiment of the present disclosure.

The assembly chamber 500 includes a space for accommodating a plurality of semiconductor light-emitting diodes. The space can be filled with a fluid, and the fluid can be an assembly solution, which includes water or the like. Thus, the assembly chamber 500 can be a water tank and configured as open-type. However, the present disclosure is not limited to this, and the assembly chamber 500 can be a closed-type chamber that comes with a closed space.

In the assembly chamber 500, a substrate S is disposed such that an assembly surface at which the semiconductor light-emitting diodes 150 are assembled is faced downwardly. For example, the substrate S is transferred to an assembly position by the substrate chuck 200.

At this time, the assembly surface of the substrate S at the assembly position faces a bottom of the assembly chamber 500. Accordingly, the assembly surface is toward a direction of gravity. The assembly surface of the substrate S is disposed to be submerged in the fluid in the assembly chamber 500.

In one embodiment, the assembly chamber 500 can be divided into two regions. Specifically, the assembly chamber 500 can be divided into an assembly region 510 and an inspection region 520. In the assembly region 510, the semiconductor light-emitting diode disposed in the fluid is assembled to the substrate S in a state in which the substrate S is submerged in the fluid.

On the other hand, in the inspection region 520, the substrate S that has been self-assembled is inspected. Specifically, the substrate S is assembled at the assembly region and then transferred to the inspection region via the substrate chuck.

The same fluid can be filled in the assembly region 510 and the inspection region 520. The substrate can be transferred from the assembly region to the inspection region in a state in which the substrate is submerged in the fluid. When the substrate S disposed in the assembly region 510 is taken out of the fluid, the previously assembled semiconductor light-emitting diode can be separated from the substrate due to surface energy between the fluid and the semiconductor light-emitting diode. For this reason, it is preferable that the substrate is transferred in a state of being submerged in the fluid.

The assembly chamber 500 can include a gate 530 configured to be capable of moving up and down such that the substrate can be transferred in a state of being submerged in the fluid. As shown in FIG. 22, the gate 530 maintains an elevated state (first state) during self-assembly or during substrate inspection, so that the fluid accommodated in the assembly region 510 and the fluid in the inspection region 520 of the assembly chamber 500 are separated from each other. The gate 530 separates the assembly region and the inspection region, thereby preventing disturbing the inspection of the substrate due to moving of the semiconductor light-emitting diode to the inspection region during self-assembly.

As shown in FIG. 23, when the substrate S is transferred, the gate 530 moves down (second state) to remove a boundary between the assembly region 510 and the inspection region 520. Accordingly, the substrate chuck 200 can transfer the substrate from the assembly region 510 to the inspection region 520 by only horizontal movement without separate vertical movement.

Meanwhile, a sonic generator for preventing agglomeration of the semiconductor light-emitting diode can be disposed at the assembly region 510. The sonic generator can prevent the plurality of semiconductor light-emitting diodes from agglomerating with each other by vibration.

Meanwhile, bottom surfaces of the assembly region 510 and the inspection region 520 can be made of a light transmissive material. In one embodiment, referring to FIG. 20, light transmission regions 511 and 512 can be provided at the bottom surfaces of the assembly region 510 and the inspection region 520, respectively. Accordingly, the present disclosure enables to monitor the substrate during self-assembly, or to perform inspection with respect to the substrate. It is preferable that an area of the light transmission region is larger than that of the assembly surface of the substrate. However, the present disclosure is not limited thereto, and the assembly chamber can be configured to perform self-assembly and inspection at the same position.

When using the substrate chuck 200, the magnetic field forming part 300, and the assembly chamber 500 as described above, the self-assembly described in FIGS. 8A to 8E can be performed. Hereinafter, a detailed structure and method for solving problems caused during self-assembly will be described in detail.

First, a structure and method for solving the most critical problem that occurs during self-assembly will be described. When describing the problem in detail, as an area of a display increases, an area of an assembly substrate increases, and as the area of the assembly substrate increases, a problem that a warpage phenomenon of the substrate increases occurs. When self-assembly is performed in a state in which the assembly substrate is warped, since the magnetic field is not uniformly formed at the surface of the assembly substrate, it is difficult to perform the self-assembly stably.

Figure 24:
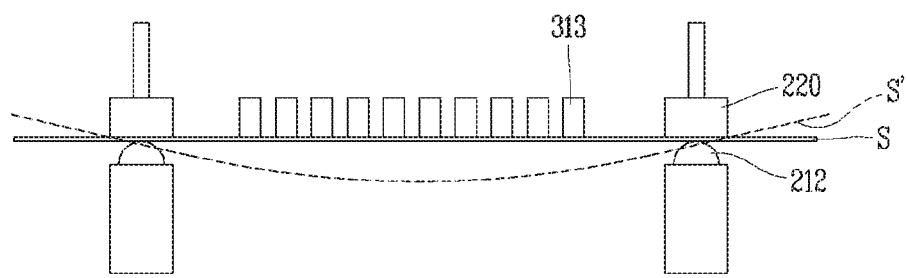
FIG. 24 is a conceptual diagram illustrating a warpage phenomenon of a substrate occurred during self-assembly.

FIG. 24 is a conceptual diagram illustrating a warpage phenomenon of a substrate occurred during self-assembly.

Referring to FIG. 24, when a substrate S maintains a flat state during self-assembly, a distance between a plurality of magnets 313 and the substrate S can be uniform. In this case, a magnetic field can be formed uniformly at an assembly surface of the substrate. However, when the substrate is actually loaded onto the substrate chuck 200, the substrate is warped due to gravity. In a warped substrate S', since a distance between the plurality of magnets 313 and the substrate S' is not constant, uniform self-assembly is difficult. Since a magnetic field forming part is disposed on an upper side of the substrate, a separate instrument for correcting the warpage phenomenon of the substrate is difficult to be disposed on the upper side of the substrate. In addition, when the separate instrument for correcting the warpage phenomenon of the substrate is disposed on a lower side the substrate, movement of the semiconductor light-emitting diodes can be restricted, and there is a problem that the instrument covers a part of the assembly surface. For this reason, it is difficult to dispose the instrument for correcting the warpage phenomenon of the substrate either on the upper side or the lower side of the substrate.

The present disclosure provides a structure and method of a substrate chuck for correcting a warpage phenomenon of the substrate.

Figure 25:
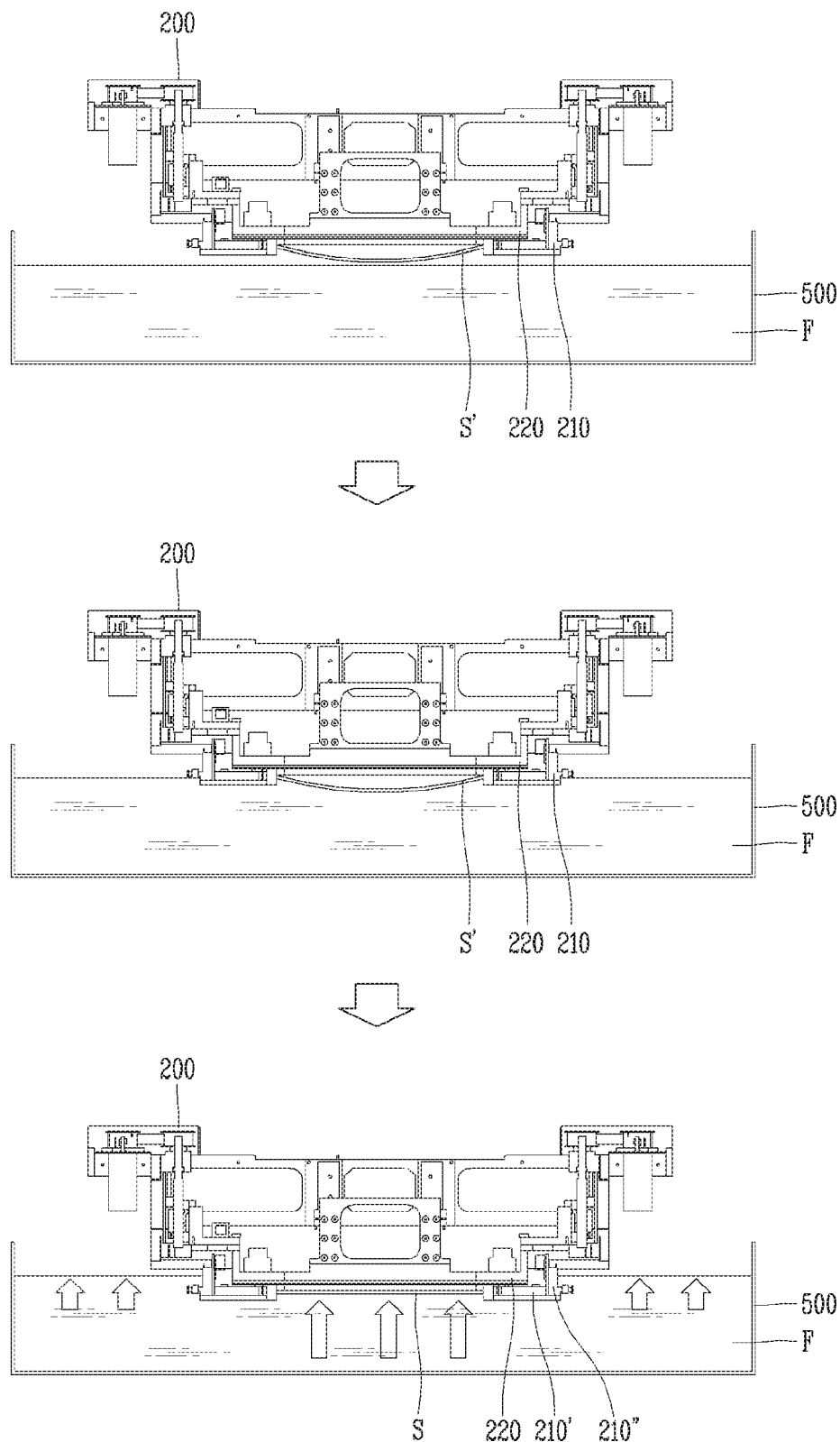
FIG. 25 is a conceptual diagram illustrating a method for correcting a warpage phenomenon of a substrate.
Figure 26:
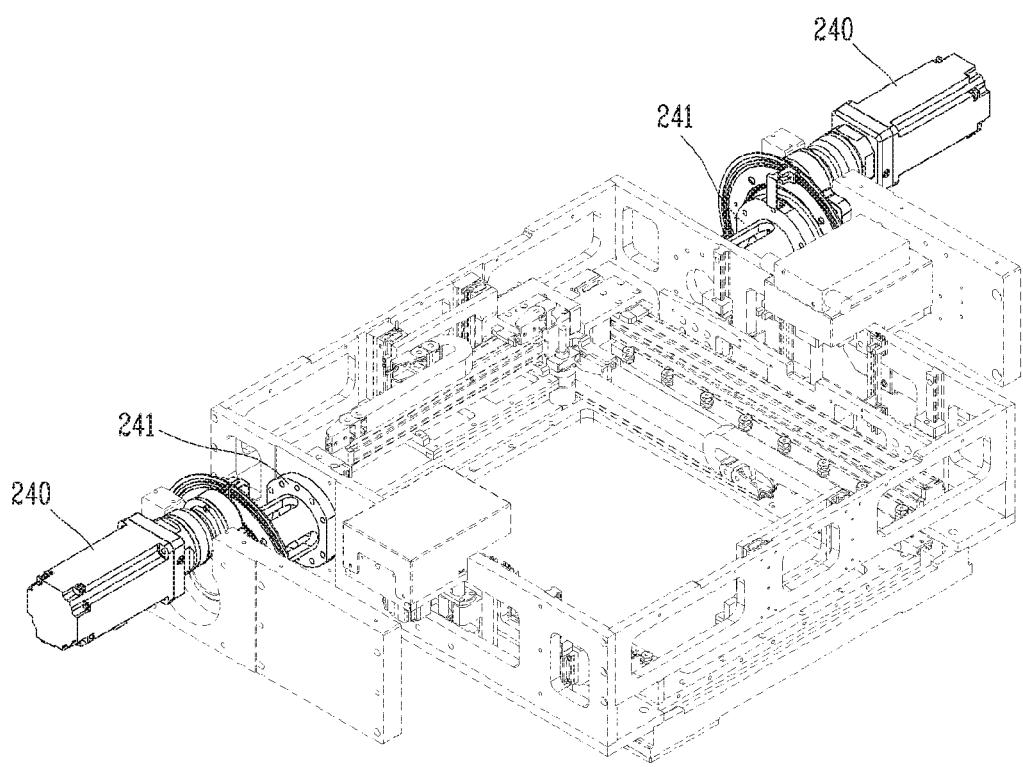
FIGS. 26 to 29 are perspective views of a substrate chuck in accordance with one embodiment of the present disclosure.
Figure 27:
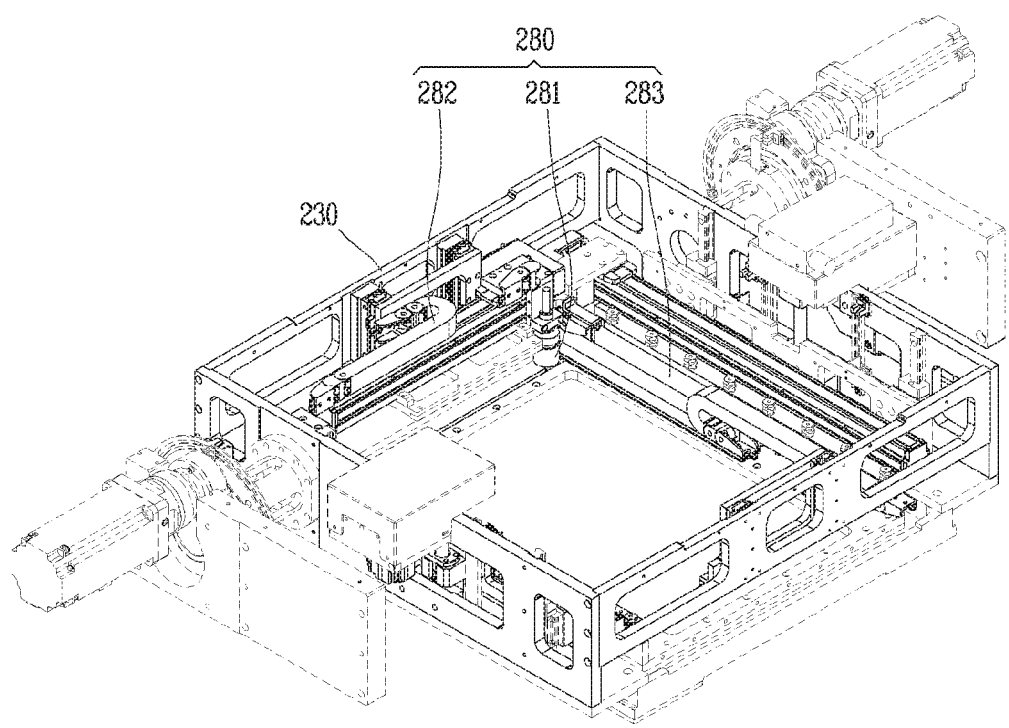
Figure 28:
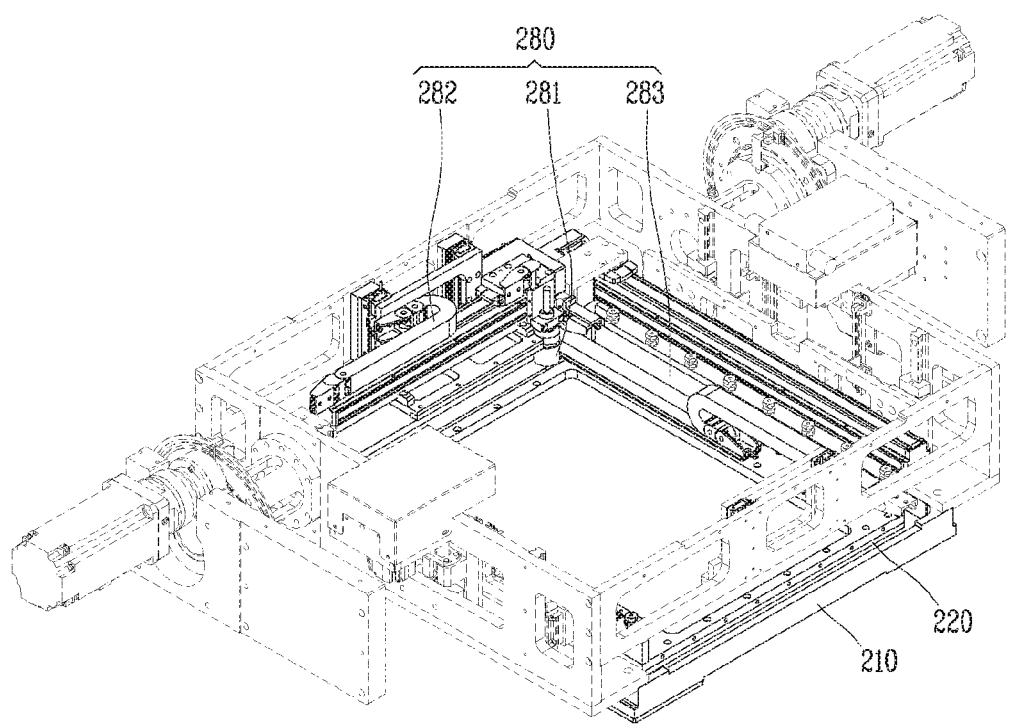

FIG. 25 is a conceptual diagram illustrating a method for correcting a warpage phenomenon of a substrate.

Referring to FIG. 25, after loading a substrate S' at a substrate chuck 200, when an assembly surface of the substrate faces the gravity direction, the substrate S' is warped. In order to minimize warping of the substrate when loading the substrate, at least one of first and second frames 210 and 220 provided at the substrate chuck applies pressure to all four corners of a rectangular substrate. Nevertheless, when the area of the substrate S' is increased, the substrate is inevitably warped due to gravity.

As shown in the second drawing of FIG. 25, after the substrate chuck 200 is moved to an assembly position, when the substrate chuck 200 is moved down at a predetermined distance, the substrate S' brings into contact with a fluid F. In a state in which the substrate S' is simply in contact with the fluid F, the warpage phenomenon of the substrate S' is not corrected. Although self-assembly can be performed in a state as shown in the second drawing of FIG. 25, it is difficult to perform uniform self-assembly.

The present disclosure further moves down the substrate chuck 200 in the state in which the substrate S' is in contact with the fluid F in order to correct the warpage phenomenon of the substrate. At this time, a sealing part 212 provided at the first frame 210 prevents the fluid F from penetrating into a window of the first frame. In addition, a sidewall portion 210" provided at the first frame 210 prevents the fluid F from flowing over the first frame to an opposite surface of the assembly surface of the substrate S'.

Here, the sealing part 212 should be formed to surround all edges of the substrate. In addition, a height of the sidewall portion 210" should be greater than a depth at which the first frame 210 is moved down to the maximum based on a state in which the first frame 210 is in contact with the fluid F. That is, when the substrate chuck 200 moves down, the fluid should not penetrate over the window and the sidewall portion 210" of the first frame 210.

When the substrate chuck 200 moves down, a surface of the fluid F is raised due to the sealing part 212 and the sidewall portion 210" as described above. At this time, buoyancy by the fluid F acts on the substrate S'. As the surface rising width of the fluid F increases, the buoyancy acting on the substrate S' increases.

In the present disclosure, the buoyancy acting on the substrate can be changed by measuring a degree of warping of the substrate S' and adjusting a descending width of the substrate chuck 200 according to the degree of warping of the substrate. When an appropriate buoyancy is applied to the substrate, as shown in the third drawing of FIG. 25, the substrate S is maintained in a flat state.

The magnetic field forming part 300 is transferred to the upper side of the substrate S in a state in which buoyancy is applied to the substrate S, and then moves horizontally along the substrate S. At this time, power of the power supply 171 is applied to the assembly electrode 161c via the electrode connection part 213. That is, self-assembly proceeds in a state in which buoyancy is applied to the assembly surface of the substrate S.

According to the above description, it is not necessary to dispose separate structures at the upper and lower sides of the substrate, and the warpage phenomenon of the substrate can be corrected. Accordingly, even when an area of the assembly substrate is increased, the present disclosure enables to achieve a high self-assembly yield.

Meanwhile, according to the self-assembling method described above, the method includes contacting the substrate with the fluid, maintaining the state in which the substrate is submerged or immersed in the fluid, and taking the substrate out of the fluid. In the above three steps, factors that adversely affect the self-assembly yield can occur. Hereinafter, description will be given of a structure of a substrate chuck that can increase a self-assembly yield by solving the problems that can occur in the above three steps.

Figure 29:
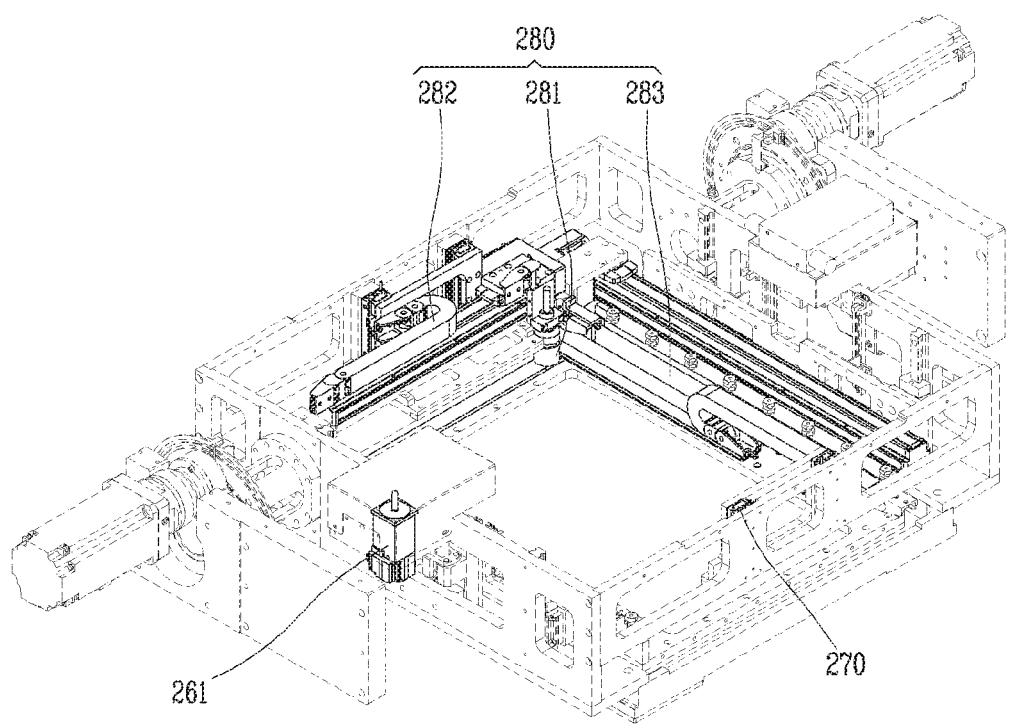
Figure 30:
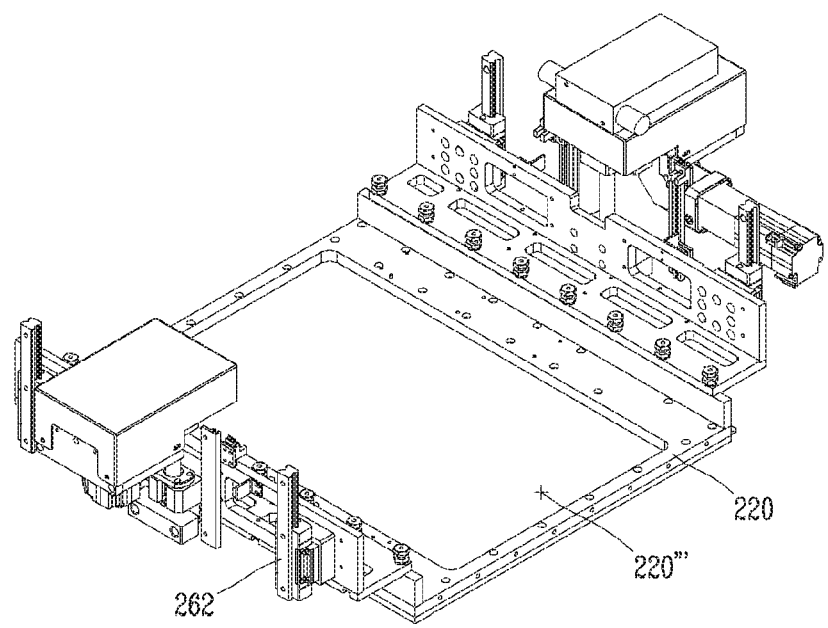
FIG. 30 is a perspective view illustrating a second frame and a frame transfer part in accordance with one embodiment of the present disclosure.
Figure 31:
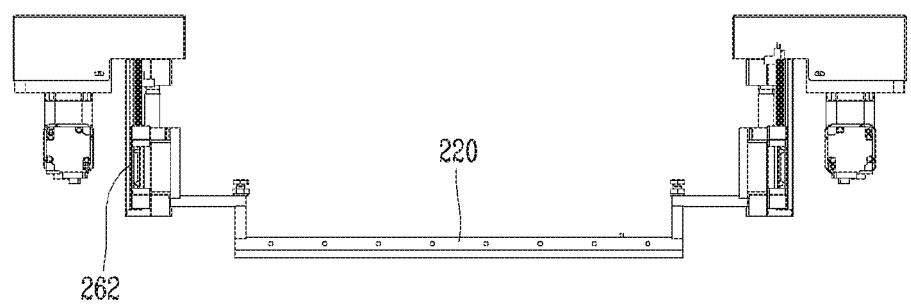
FIG. 31 is a diagram illustrating one side of a second frame and a frame transfer part in accordance with one embodiment of the present disclosure.

FIGS. 26 to 29 are perspective views of a substrate chuck in accordance with one embodiment of the present disclosure, FIG. 30 is a perspective view illustrating a second frame and a frame transfer part in accordance with one embodiment of the present disclosure, and FIG. 31 is a diagram illustrating one side of a second frame and a frame transfer part in accordance with one embodiment of the present disclosure.

Since the substrate chuck according to the present disclosure can include all of the components described with reference to FIGS. 11 to 14, the description of the contents given with reference to FIGS. 11 to 14 will be omitted.

First, the rotating part 240 provided in the substrate chuck will be described.

Referring to FIGS. 26 to 29, the rotating part 240 basically serves to invert the substrate up and down. The semiconductor light emitting diode remains fixed to the substrate due to the electric field formed on the assembly electrode during the self-assembly. However, when no voltage is applied to the assembly electrode, the semiconductor light emitting diode is not fixed to the substrate.

Since the assembly surface of the substrate faces the direction of gravity during the self-assembly, when a voltage is not applied to the assembly electrode in a state in which the self-assembly is completed, the pre-assembled semiconductor light emitting diodes are separated from the substrate. As described with reference to FIGS. 11 to 14, since the voltage applied to the assembly electrode is transmitted through the substrate chuck, when the substrate is unloaded from the substrate chuck, the voltage is no longer applied to the assembly electrode. When the substrate is unloaded while the assembly surface of the substrate faces the direction of gravity, the pre-assembled semiconductor light emitting diodes are separated from the substrate.

Due to this, the assembly surface of the substrate should face a direction opposite to gravity when the substrate is unloaded after the self-assembly is finished. The rotating part 240 allows the assembly surface of the substrate facing the gravity direction to face the direction opposite to the gravity, so as to prevent the semiconductor light emitting diode from being separated from the substrate.

The rotating part 240 includes a rotating shaft 241. At least a portion of the substrate chuck 200 rotates centering on the rotating shaft 241. The rotating shaft 241 provided at the substrate chuck 200 according to the present disclosure is disposed at a position spaced a predetermined distance apart from a center of the substrate support part. More specifically, the rotating shaft 241 is located at an end portion of the substrate support part.

In one embodiment, the rotating shaft 241 can be disposed in the fixing part 230 provided at the substrate chuck. The fixing part 230 can include a sidewall part, and the rotating shaft 241 can be disposed at an end portion of the sidewall part provided in the fixing part 230.

When the substrate chuck 200 rotates centering on the rotating shaft 241 positioned at the end portion of the substrate support part, the substrate loaded on the substrate chuck 200 can be disposed obliquely with the ground. The present disclosure improves a self-assembly yield by allowing the fluid surface and the substrate to be disposed obliquely when the substrate and the fluid are in contact with each other and when the substrate is taken out of the fluid.

Specifically, when the substrate is in contact with the fluid, the rotating part 240 provided at the substrate chuck 200 rotates only until the substrate is disposed obliquely with the surface of the fluid. Thereafter, the vertical moving part provided at the substrate chuck 200 moves the substrate chuck downward until one end of the substrate is brought into contact with the fluid. Thereafter, the rotating part 240 rotates the substrate chuck so that the substrate is sequentially brought into contact with the fluid in one direction. When the rotating shaft 241 is disposed at a central portion of the substrate support part instead of the end portion thereof, the substrate cannot be sequentially brought into contact with the fluid along the one direction. The present disclosure allows the substrate to sequentially contact the fluid along the one direction, so that bubbles formed between the substrate and the fluid are removed by being pushed to the edge of the substrate.

On the other hand, after the self-assembly is finished, the rotating part 240 rotates the substrate chuck 200 in a direction opposite to the direction in which the substrate chuck is rotated when the substrate is in contact with the fluid. As a result, the substrate is separated from the fluid along the same trajectory as being in contact with the fluid. When the rotating part 240 is disposed at the central portion of the substrate support part, a part of the substrate is additionally submerged in the fluid during the rotation of the substrate chuck 200, and in this process, buoyancy caused by the fluid is unevenly applied to the substrate. This can damage the substrate. In the present disclosure, in order to prevent the non-uniform buoyancy from acting on the substrate during the process of separating the substrate from the fluid after completion of the self-assembly, the rotating shaft 240 is disposed at the end portion of the substrate support part.

As described above, the present disclosure arranges the rotating part of the substrate chuck at the end portion of the substrate support part, in order to solve the problem that occurs when the substrate is in contact with the fluid and a problem that occurs when the substrate is separated from the fluid.

Hereinafter, a structure of the substrate chuck for solving a problem which arises in a state in which the substrate is submerged in the fluid will be described.

When the substrate is submerged in the fluid, buoyancy caused due to the fluid is applied to the assembly surface of the substrate. As described with reference to FIGS. 11 to 14, the second frame 220 presses the substrate and the substrate is in close contact with the sealing part 212 of the first frame 210. Accordingly, even though buoyancy is applied to the assembly surface of the substrate, the fluid does not penetrate between the substrate and the first frame 210.

However, since the buoyancy caused due to the fluid acts continuously while the substrate is submerged in the fluid, if the substrate and the first frame 210 are not completely sealed from each other, the fluid can penetrate between the substrate and the first frame 210. For example, buoyancy acting on the substrate can increase as a depth at which the substrate is submerged in the fluid increases. As a result, the sealing between the substrate and the first frame 210 can be temporarily destroyed.

Since the electrode connection part 213 is connected to the edge of the substrate, even a small amount of fluid penetrated can have a fatal effect on the self-assembly yield, and cause damage on the substrate itself.

The present disclosure has structures for preventing the substrate from being broken or destroyed by buoyancy acting on the substrate during self-assembly.

As described above, the present disclosure includes the frame moving part for vertically moving at least one of the first and second frames. In one embodiment, referring to FIG. 29, the motor 261 provided at the frame moving part can be fixed to the fixing part 230 so as to supply power to another part. Referring to FIGS. 30 and 31, the guide part 262 is connected to the second frame 220. The guide part 262 receives power from the motor 261 to move the second frame 220 up and down. However, the present disclosure is not limited thereto, and can alternatively include a transfer component for vertically transferring the first frame 210.

After the substrate is loaded between the first and second frames 210 and 220, the frame moving part vertically moves at least one of the first and second frames 210 and 220 so that the first and second frames 210 and 220 press the substrate.

When loading the substrate, as described with reference to FIGS. 11 to 14, the protrusions 211 for guiding the alignment position of the substrate can be formed on at least one of the first and second frames 210 and 220, to guide the substrate to be aligned on a correct position.

After the substrate is aligned on the correct position by using the protrusions 211, the frame moving part vertically moves at least one of the first and second frames 210 and 220. Accordingly, the sealing part 212 provided on the first frame 210 is brought into contact with an entire edge of one surface (first surface), on which the assembly surface is located, of both surfaces of the substrate, and the bottom portion of the second frame 220 is brought into contact with an entire edge of another surface (second surface), which is opposite to the one surface where the assembly surface is located, of the both surfaces of the substrate. Referring to FIG. 30, the bottom portion around the hole 220''' formed at the second frame 220 is in contact with the entire edge of the substrate.

Accordingly, the sealing part 212 provided on the first frame 210 is in close contact with the entire edge of the first surface of the substrate, and the second frame 220 presses the entire edge of the second surface of the substrate. In one embodiment, when the substrate has a rectangular plate shape, the sealing part 212 is disposed to surround all of four edges of the substrate, and the second frame 220 presses all of the four edges of the substrate.

The present disclosure allows the second frame 220 to press all of the edges of the substrate, thereby primarily minimizing the warpage of the substrate and preventing the fluid from penetrating between the substrate and the first frame 210 during self-assembly.

Furthermore, the present disclosure has an additional structure that can protect the substrate during self-assembly.

Specifically, referring to FIG. 29, the present disclosure can further include an auxiliary clamp 270 that fixes the second frame 220 while the second frame 220 presses the substrate. The auxiliary clamp 270 can be disposed on the sidewall of the fixing part 230.

The auxiliary clamp 270 can be configured to additionally press at least one of the second frame 220 and the edges of the substrate while the second frame 220 presses the substrate using the frame moving part.

In one embodiment, the auxiliary clamp 270 can be configured as a cylindrical structure. The auxiliary clamp 270 with the cylindrical structure is made to be stretchable in a state fixed to the sidewall of the fixing part 230. The auxiliary clamp 270 is stretched toward the substrate while the substrate is pressed by the second frame 220, to additionally press at least one of the second frame 220 and the substrate. However, the auxiliary clamp 270 is not limited thereto.

The frame moving part and the auxiliary clamp utilize a known component capable of causing vertical movement of an object, but the frame moving part and the auxiliary are preferably configured as different components. This is to allow one of the frame moving part and the auxiliary clamp to maintain the sealing state between the substrate and the first frame 210 even though a functional problem occurs in the other.

For example, the frame moving part can be a vertical moving device using a servo motor, and the auxiliary clamp can be a vertical moving device using a cylinder. However, the present disclosure is not limited thereto.

On the other hand, at least one of the frame moving part and the auxiliary clamp can increase pressure for pressing the substrate, in proportion to a depth at which the substrate is submerged in the fluid. For example, the frame moving part can increase pressure for pressing the substrate, in proportion to a depth at which the substrate is additionally moved down, based on the state in which the substrate is in contact with the fluid.

As described above, the present disclosure prevents the substrate from being damaged due to buoyancy acting on the substrate during self-assembly.

In addition, the substrate chuck 200 can be provided with a device that can sense a warped degree of the substrate. Specifically, referring to FIG. 29, the fixing part 230 is provided with a sensor module 280 configured to measure a distance to an object to be measured.

The sensor module 280 includes a displacement sensor 281 and sensor transfer parts 282 and 283.

The displacement sensor 281 is moved by the sensor transfer parts 282 and 283 disposed on sidewalls of the fixing part. The sensor transfer parts 282 and 283 allow the displacement sensor 281 to move in X-axis and Y-axis directions, respectively. The displacement sensor 281 measures a distance to the substrate by performing horizontal movement with respect to the substrate based on a reference plane defined by the sensor transfer parts 282 and 283.

As described above, the substrate chuck 200 according to the present disclosure can serve to support and transfer the substrate, improve a self-assembly yield, and prevent the substrate from being damaged.

What is claimed is:

1. A substrate chuck for allowing one surface of a substrate to be in contact with a fluid in an assembly chamber, the substrate chuck comprising:
   a first frame having a first hole at a central portion thereof;
   a second frame having a second hole at a central portion thereof and disposed to overlap the first frame, wherein the first frame comprises:
      a bottom portion at which the first hole is formed; and
      a sidewall portion formed on a peripheral edge of the bottom portion; and
   a frame transfer part connected to the second frame and configured to vertically move the second frame with respect to the first frame,
   wherein a height of the sidewall portion is greater than a depth at which the substrate is placed into the fluid in the assembly chamber,
   wherein the first frame comprises a sealing part disposed at an edge of the first hole, wherein the first frame and the second frame are configured to be disposed at a first side and a second side of the substrate, respectively with the substrate interposed therebetween, and wherein the frame transfer part is configured to transfer the second frame so that a first surface of the substrate is in contact with the fluid while the second frame presses on a second surface of the substrate.

2. The substrate chuck of claim 1,
wherein the first and second holes formed at the respective first frame and the second frame are configured to dispose to overlap an assembly surface of the substrate.

3. The substrate chuck of claim 2,
wherein the frame transfer part is configured to transfer the second frame such that the first surface of the substrate is submerged in the fluid while the second frame presses on the substrate.

4. The substrate chuck of claim 3, wherein the second frame is encircled by the sidewall portion while pressing on the substrate.

5. The substrate chuck of claim 1, further comprising:
a fixing part fixing the frame transfer part and the first frame,
wherein the frame transfer part connects the fixing part and the second frame, and has a variable length so that the second frame moves vertically.

6. The substrate chuck of claim 5, wherein the second frame is configured to press at least four edges among edges of the substrate while pressing on the substrate.

7. The substrate chuck of claim 1, wherein the sealing part is arranged to press on the substrate as at least one of the first frame and the second frame presses on the substrate.

8. The substrate chuck of claim 1, wherein the sealing part is made of a material that is not adhered to the substrate.

9. The substrate chuck of claim 1, wherein the first frame comprises an electrode connection part configured to apply power to an assembly electrode provided at the substrate so as to generate an electric field.

10. The substrate chuck of claim 9, wherein the sealing part is disposed closer to the first hole of the first frame than the electrode connection part.

11. The substrate chuck of claim 1, wherein the sidewall portion is configured to prevent the fluid from entering a space formed by the first frame, the sidewall portion, and the substrate.

12. The substrate chuck of claim 1, wherein the sealing part is disposed closer to the first hole of the first frame than the sidewall portion.

13. The substrate chuck of claim 1, wherein the second frame includes a first part extending parallel to the bottom portion of the first frame and a second part extending parallel to the sidewall portion of the first frame so that the first part and the second part are arranged perpendicular to each other, and
wherein the sealing part is configured to be interposed between the bottom portion of the first frame and the second part of the second frame.

14. A substrate chuck for allowing one surface of a substrate to be in contact with a fluid in an assembly chamber, the substrate chuck comprising:
a first frame having a first hole at a central portion thereof;
a second frame having a second hole at a central portion thereof to overlap the first hole, and disposed to overlap the first frame;
a frame transfer part connected to the second frame and configured to vertically move the second frame with respect to the first frame; and
a sealing part disposed between the first hole and a sidewall portion of the first frame,
wherein the first frame comprises:
a bottom portion at which the first hole is formed; and
the sidewall portion formed on a peripheral edge of the bottom portion,
wherein a height of the sidewall portion is greater than a depth at which the substrate is placed into the fluid in the assembly chamber,
wherein the substrate is configured to be disposed between the first frame and the second frame,
wherein the first frame allows a lower surface of the substrate to be exposed through the first hole and the second frame allows an upper surface of the substrate to be exposed through the second hole,
wherein the sealing part is disposed between an upper surface of the first frame and a bottom surface of the second frame, and
wherein the sealing part surrounds the first hole.

15. The substrate chuck of claim 14, wherein portion of the second frame is surrounded by the sidewall portion of the first frame.

16. The substrate chuck of claim 14, further comprising a fixing part coupling the frame transfer part and the first frame,
wherein the frame transfer part couples the fixing part and the second frame.

17. The substrate chuck of claim 14, wherein the first frame comprises an electrode connection part disposed between the first hole of the first frame and the sidewall portion of the first frame.

18. The substrate chuck of claim 14, wherein the sealing part is disposed closer to the first hole of the first frame than the sidewall portion of the first frame.

19. A substrate chuck for allowing one surface of a substrate to be in contact with a fluid in an assembly chamber, the substrate chuck comprising:
a first frame having a first hole at a central portion thereof; and
a second frame having a second hole at a central portion thereof and disposed to overlap the first frame, wherein the first frame comprises:
a bottom portion at which the first hole is formed; and
a sidewall portion formed on a peripheral edge of the bottom portion,
wherein a height of the sidewall portion is greater than a depth at which the substrate is placed into the fluid in the assembly chamber,
wherein the first frame comprises a sealing part disposed at an edge of the first hole, and
wherein the first frame comprises an electrode connection part configured to apply power to an assembly electrode provided at the substrate so as to generate an electric field.

* * * * *